United States Patent
Peng et al.

(10) Patent No.: US 10,878,162 B2
(45) Date of Patent: Dec. 29, 2020

(54) METAL WITH BURIED POWER FOR INCREASED IC DEVICE DENSITY

(71) Applicant: TAIWAN SEMICONDUCTOR MANUFACTURING COMPANY LTD., Hsinchu (TW)

(72) Inventors: Shih-Wei Peng, Hsinchu (TW); Chih-Ming Lai, Hsinchu (TW); Hui-Ting Yang, Hsinchu (TW); Jiann-Tyng Tzeng, Hsinchu (TW); Wei-Cheng Lin, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/669,338

(22) Filed: Oct. 30, 2019

(65) Prior Publication Data
US 2020/0134128 A1   Apr. 30, 2020

Related U.S. Application Data

(60) Provisional application No. 62/753,286, filed on Oct. 31, 2018.

(51) Int. Cl.
*G06F 30/394* (2020.01)
*G06F 30/392* (2020.01)

(52) U.S. Cl.
CPC .................... *G06F 30/394* (2020.01)

(58) Field of Classification Search
CPC ............................ G06F 30/392; G06F 30/394
See application file for complete search history.

(56) References Cited

U.S. PATENT DOCUMENTS

| | | | |
|---|---|---|---|
| 5,981,987 A * | 11/1999 | Brunolli | H01L 27/118 257/207 |
| 7,260,442 B2 | 8/2007 | Hwang et al. | |
| 9,256,709 B2 | 2/2016 | Yu et al. | |
| 2001/0054720 A1* | 12/2001 | Brunolli | H01L 27/0207 257/207 |
| 2014/0040838 A1 | 2/2014 | Liu et al. | |
| 2014/0217513 A1* | 8/2014 | Hayashi | H01L 27/0207 257/369 |
| 2015/0278429 A1 | 10/2015 | Chang | |

* cited by examiner

*Primary Examiner* — Vuthe Siek
(74) *Attorney, Agent, or Firm* — Hauptman Ham, LLP

(57) ABSTRACT

A method of designing a layout includes generating first routing tracks assigned to a first color group, generating second routing tracks assigned to a second color group, wherein a first routing track of the first routing tracks is between adjacent second routing tracks of the second routing tracks, and specifying a color stitching region connecting a selected first routing track of the first routing tracks with a selected second routing track of the second routing tracks of the layout, wherein the color stitching region represents a conductive region that connects a first conductive element represented by the selected first routing track with a second conductive element represented by the selected second routing track through an exposed portion of the selected first routing track, and wherein the exposed portion is at a removed portion of a sidewall structure surrounding the selected first routing track.

20 Claims, 21 Drawing Sheets

METAL WITH BURIED POWER FOR INCREASED IC DEVICE DENSITY

PRIORITY CLAIM

This application claims the benefit of U.S. Provisional Application No. 62/753,286, filed on Oct. 31, 2018, the entirety of which is incorporated by reference herein.

BACKGROUND

The semiconductor integrated circuit (IC) industry has continued to experience rapid growth with technological advances in IC materials and design producing successive generations of ICs, each new generation having smaller geometries and more complex circuits than the previous generation. The complexity of the associated layout, device structures, and manufacturing processes for producing each new generation of ICs has increased correspondingly to achieve the designed functional density.

The performance of advanced patterning and etching processes associated with metal patterning are affected by density gradient effects (DGE) and/or landing effects (LE) associated with the specific IC device layout configuration being manufactured. Consideration and adjustment of the relative location and spacing of the power metal pattern is used to mitigate some of the DGE/LE issues, allow for increased device density, and improve the uniformity and performance of the resulting ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
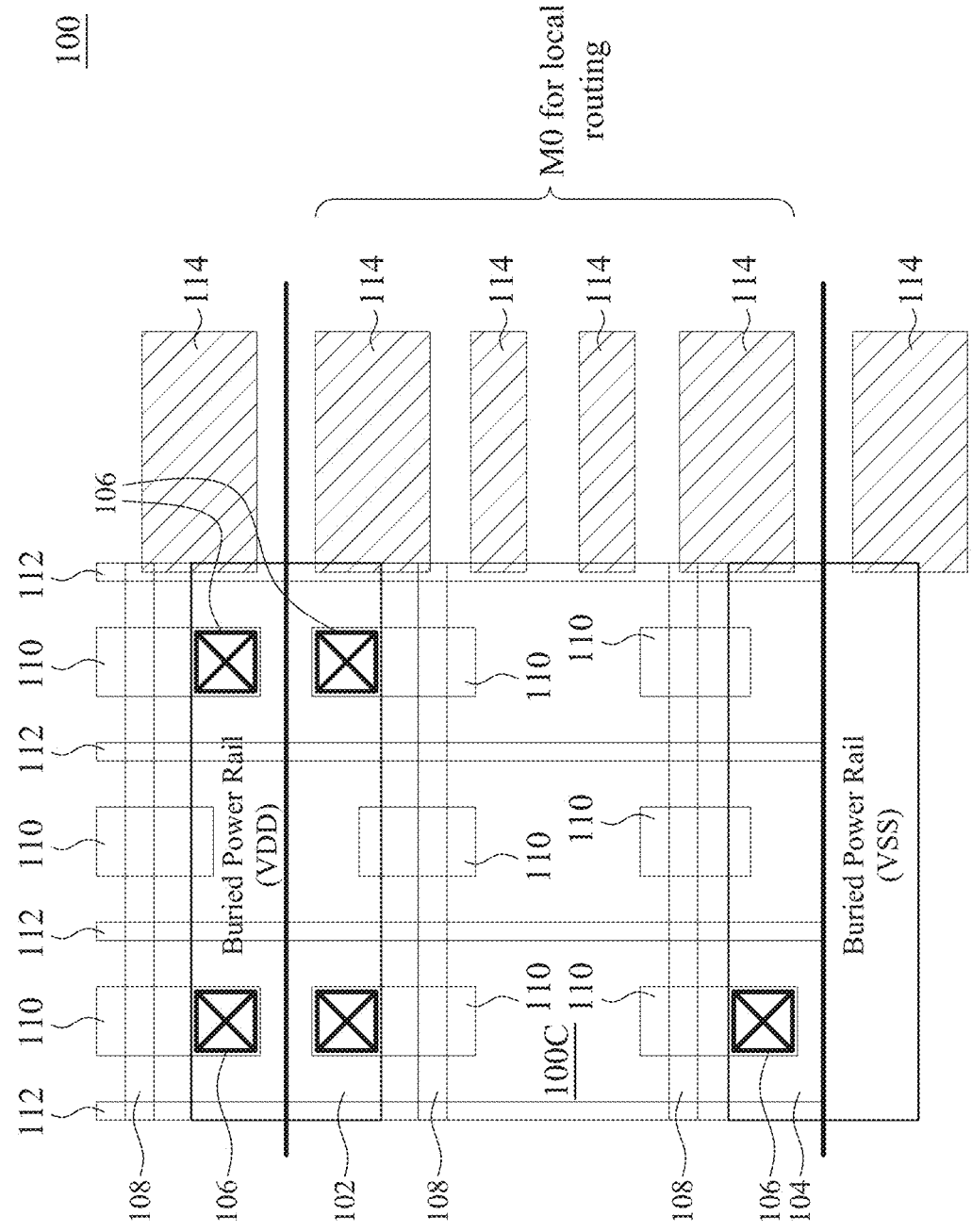
FIG. 1 is a top view of an IC layout diagram in accordance with some embodiments.

This description of the exemplary embodiments is intended to be read in connection with the accompanying drawings, which are to be considered part of the entire written description. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Extreme ultraviolet (EUV) lithography is being used more widely to achieve smaller metal pitches. Compared to current light sources, EUV has shorter wavelength which can provide higher resolution and better CDU (critical dimension uniformity). In addition to the patterning improvements, in some embodiments the use of EUV lithography reduces the number of photomasks from multiple patterning to double or even single layer patterning, thereby reducing the processing time and improving process yield.

Methods for simplifying chip-level routing and manufacture of semiconductor IC layout designs generated using an electronic design automation (EDA) tool involve forming a regular metal pattern, e.g., a base level metal interconnect pattern (metal zero (M0)), and then selectively cutting (removing) portions of the metal pattern according to the applicable design rules. Metal cuts on the base level metal interconnect pattern (CM0) at the cell boundaries of a standard cell layout (boundary metal cuts) are used to separate/disconnect adjacent standard cells such that each of the separated cells are able to perform independently designated function(s).

The conductive layers from which the gate electrodes and source/drain conductors are patterned comprise one or more conductive materials including aluminum, copper, cobalt, tungsten, titanium, nickel, gold, platinum, graphene, silicides, salicides, and mixtures and alloys thereof, applied to a substrate singly, in series, and/or in combination. The conductive layer deposition processes include one or more of chemical vapor deposition (CVD) processes, atomic layer deposition (ALD) processes, plasma vapor deposition (PVD) process, electroplating processes, electroless plating processes, and any other suitable application process(es) or combinations thereof. In some embodiments, the conductive layers are formed over a nitrogen-free anti-reflective coating (NFARC) layer for improved patterning control.

A standard cell structure includes one or more standard cells from a standard cell library, according to some embodiments. The standard cell is selected from a group comprising AND, OR, XOR, XNOR, NAND, inverter, and other suitable logic devices. In some embodiments, metal cuts (e.g., boundary metal cuts and internal metal cuts) are located on the base level metal interconnect pattern by using a modified metal-cut mask layer. As used herein, the term "boundary metal cuts" refers to metal cuts placed along cell boundaries of standard cells and term "internal metal cuts" refers to metal cuts other than boundary metal cuts performed on the standard cells. Terms "boundary metal cuts" and "internal metal cuts" are simply relative terms and do not indicate any difference in the patterning, developing, and/or etching of the designated metal cuts.

In various embodiments, an IC manufacturing method and corresponding IC layouts and IC structures include metal zero (M0) layer segments corresponding to multiple mask sets in which a segment corresponding to a first mask set is joined, or stitched, to a segment corresponding to a second mask set. Compared to approaches that do not include stitched M0 segments, IC layouts and structures including stitched M0 segments provide improved signal routing flexibility, particularly in applications in which M0 signal lines overlie buried power rails, e.g., cell layouts that span more than two buried power rails.

FIG. 1 depicts a simplified, non-limiting example of an IC layout diagram including buried power rails and M0 regions in accordance with various embodiments, FIGS. 2A-6N illustrate various manufacturing operations used to join, or stitch, the M0 signal lines, and FIGS. 7-9B depict non-limiting examples of IC layouts including stitched M0 regions.

FIG. 1 is a top view of an IC layout diagram 100 including an IC layout cell 100C in accordance with some embodiments. In various embodiments, IC layout cell 100C corresponds to a standard cell, a custom cell, an engineering change order (ECO) cell, a logic gate cell, a memory cell, or another type of cell or combination of cells capable of being defined in an IC layout diagram. In various embodiments, a logic gate cell includes one or more of an AND, OR, NAND, NOR, XOR, INV, AND-OR-Invert (AOI), OR-AND-Invert (OAI), MUX, flip-flop, BUFF, latch, delay, or clock device. In various embodiments, a memory cell includes one or more of a static random access memory (SRAM), a dynamic RAM (DRAM), a resistive RAM (RRAM), a magnetoresistive RAM (MRAM), or read only memory (ROM) cell, or another device capable of having multiple states representative of logical values.

IC layout cell 100C includes a buried VDD power rail 102 and a buried VSS power rail 104 in a substrate (not labeled), via regions 106, active regions 108, metal-like defined regions 110, gate regions 112, and metal zero (M0) regions 114. The embodiment of IC layout cell 100C depicted in FIG. 1 is a non-limiting example including representations of the various elements simplified for the purpose of illustration. In various embodiments, the M0 regions 114 depicted in FIG. 1 correspond to M0 regions manufactured based on color stitching sequences as discussed below with respect to FIGS. 2A-9B.

Buried power rails, e.g., buried power rails 102 and 104, are regions in an IC layout diagram included in a manufacturing process as part of defining conductive segments positioned in a substrate below and/or between other features of an IC device manufactured in accordance with the IC layout diagram, as discussed below. In various embodiments, a conductive segment includes one or more of polysilicon, copper (Cu), silver (Ag), tungsten (W), titanium (Ti), nickel (Ni), tin (Sn), aluminum (Al) or another metal or material suitable for providing a low resistance electrical connection between IC structure elements.

A via region, e.g., one of via regions 106 depicted in FIG. 1, is a region in an IC layout diagram included in a manufacturing process as part of defining a via structure configured to provide a low resistance electrical connection between conductive segments in two or more levels and/or layers of the manufacturing process. Via structures include one or more of copper (Cu), silver (Ag), tungsten (W), titanium (Ti), nickel (Ni), tin (Sn), aluminum (Al) or another metal or material suitable for providing low resistance electrical connections between IC structure layers.

An active region, e.g., an active region 108 depicted in FIG. 1, is a region in an IC layout diagram included in a manufacturing process as part of defining an active area, also referred to as an oxide diffusion or definition (OD) in some embodiments, in a semiconductor substrate.

An active area is a continuous section of the semiconductor substrate having either n-type or p-type doping that includes various semiconductor structures, including one or more fins of a FinFET in some embodiments. In various embodiments, an active area is located within a well, i.e., either an n-well or a p-well, within the semiconductor substrate and/or is electrically isolated from other elements in the semiconductor substrate by one or more isolation structures, e.g., one or more shallow trench isolation (STI) structures.

A fin is a raised, elongated portion of an active area extending in a first direction including one or more of an elementary semiconductor, e.g., silicon (Si) or germanium (Ge), a compound semiconductor, e.g., silicon germanium (SiGe), silicon carbide (SiC), gallium arsenide (GaAs), gallium phosphide (GaP), indium phosphide (InP), indium arsenide (InAs), or indium antimonide (ISb), or an alloy semiconductor, e.g., GaAsP, AlInAs, AlGaAs, GaInAs, GaInP, or GaInAsP, or the like.

In some embodiments, an active area includes one or more source/drain (S/D) structures corresponding to one or more S/D regions within the active region used to define the active area. An S/D structure is a semiconductor structure within an active area, adjacent to or including portions of the one or more fins, and configured to have a doping type opposite to that of other portions of the active area. In some embodiments, an S/D structure is configured to have lower resistivity than other portions of the active area, e.g., by including one or more portions having doping concentrations greater than one or more doping concentrations otherwise present throughout the active area. In various embodiments, S/D structures include epitaxial regions of a semiconductor material, e.g., Si, SiGe, and/or SiC.

An MD region, e.g., an MD region 110 depicted in FIG. 1, is a conductive region in an IC layout diagram included in a manufacturing process as part of defining an MD segment in and/or on a semiconductor substrate. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., a metal zero layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more of silicon (Si), silicon-germanium (SiGe), silicon-carbide (SiC)., boron (B), phosphorous (P), arsenic (As), gallium (Ga), a metal as discussed above, or another material suitable for providing the low resistance level. In some embodiments, an MD segment includes a dopant having a doping concentration of about $1*10^{16}$ per cubic centimeter (cm-3) or greater.

In various embodiments, one or more MD regions, e.g., one or more of MD regions 110, overlaps one or more active regions, e.g., one or more of active regions 108, and the corresponding one or more MD segments includes at least a portion within the corresponding one or more active areas. In various embodiments, one or more MD segments abuts or includes some or all of one or more S/D structures in the corresponding one or more active areas.

A gate region, e.g., one of gate regions 112 depicted in FIG. 1, is a region in an IC layout diagram included in a manufacturing process as part of defining a gate structure overlying the semiconductor substrate. A gate structure is a volume including one or more conductive segments including one or more conductive materials, e.g., polysilicon, one or more metals, and/or one or more other suitable materials, substantially surrounded by one or more insulating materials, e.g., silicon dioxide and/or one or more other suitable materials, the one or more conductive segments thereby being configured to control a voltage provided to underlying and adjacent dielectric layers. In various embodiments, a dielectric layer includes one or more of silicon dioxide and/or a high-k dielectric material, e.g., a dielectric material having a k value higher than 3.8 or 7.0. In some embodiments, a high-k dielectric material includes aluminum oxide, hafnium oxide, lanthanum oxide, or another suitable material.

A conductive region, e.g., one of M0 regions 114 depicted in FIG. 1, is a conductive region in an IC layout diagram included in a manufacturing process as part of defining a segment of a conductive layer of the manufacturing process overlying other features, e.g., each of the features discussed above with respect to buried power rails 102 and 104, via regions 106, active regions 108, MD regions 110, and gate regions 112.

In various embodiments, M0 regions 114 include a first subset corresponding to a first mask set and a second subset corresponding to a second mask set different from the first mask set. Each of the first and second mask sets defines a subset of IC features having dimensions based on a standard feature size, and the subsets of features are arranged in a complementary manner to form combined features having dimensions smaller than those of the features formed by a single one of the mask sets. In various embodiments, a given mask set is referred to as a color group based on using multiple colors in an IC layout diagram to distinguish between multiple mask sets.

As discussed below, M0 regions of IC layout diagram 100 include a M0 region, also referred to as a color stitching region in some embodiments, used to define a M0 segment that electrically connects a M0 segment of the first subset to a M0 segment of the second subset. In some embodiments, this M0 segment is referred to as a stitching segment. Compared to approaches that do not include stitched M0 segments, IC structures including stitched M0 segments provide improved signal routing flexibility, particularly in applications in which M0 signal lines overlie buried power rails, e.g., cell layouts that span more than two buried power rails.

In the embodiment depicted in FIG. 1, M0 regions 114 are arranged in a metal zero (M0) pattern above buried VDD power rail 102 and buried VSS power rail 104 according to some embodiments. Utilizing buried VDD and/or VSS lines, i.e., conductive structures formed below the first metal pattern through which connection to VDD and/or VSS voltages are provided to the functional elements of an integrated circuit, increases the area available for the M0 signal lines corresponding to M0 regions 114 to be arranged, thereby improving routing flexibility, e.g., by allowing the number of M0 signal lines to be increased and/or the width of the signal lines to be increased. In some embodiments, the use of buried power lines and/or ground lines provides unobstructed surface regions between adjacent ground lines in which double height (DH) metal interconnect patterns are formed.

Figure 2A:
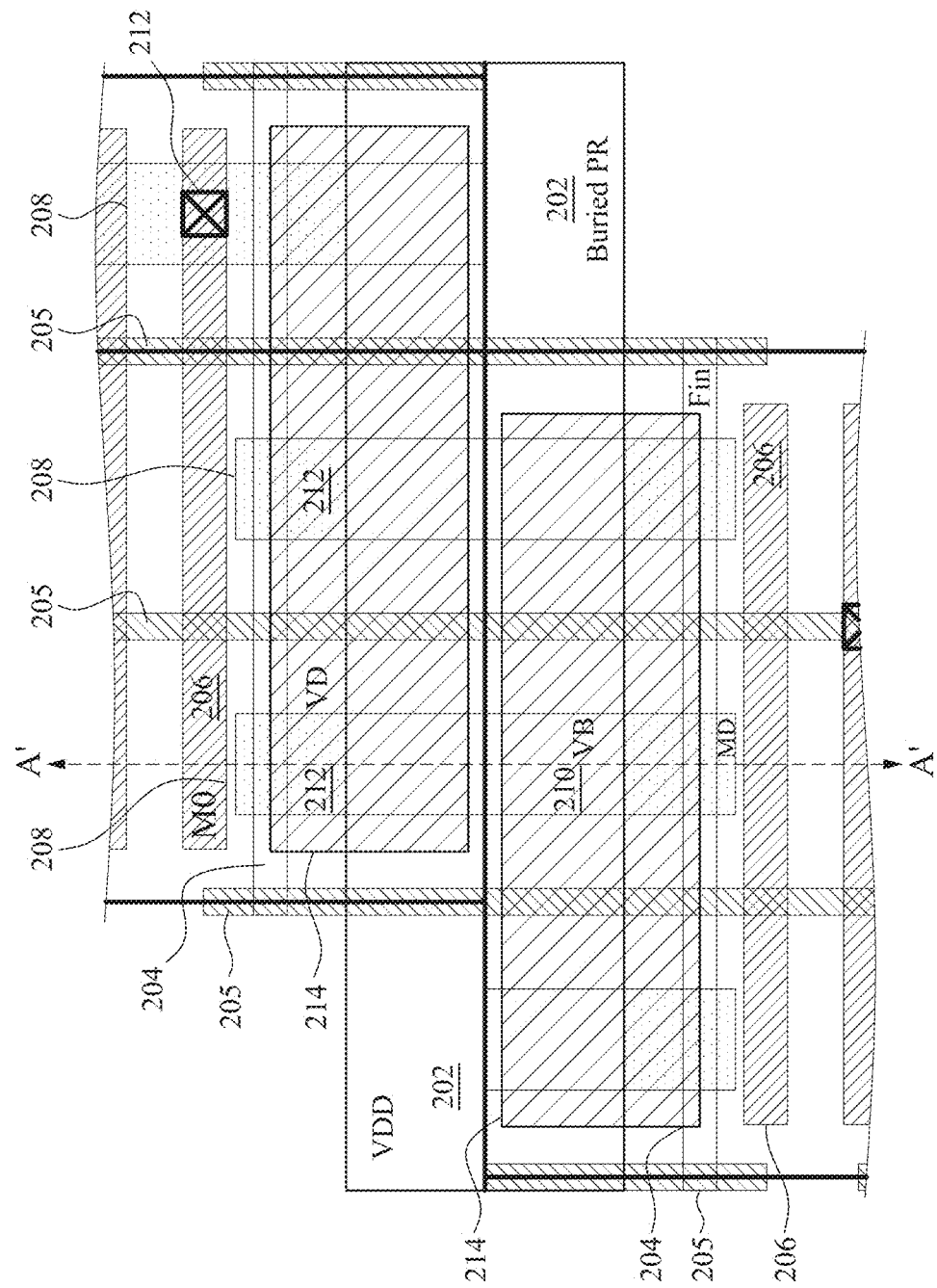
FIG. 2A is a top view of an integrated circuit layout cell in accordance with some embodiments.

FIG. 2A is a top view of an integrated circuit layout cell 200 in accordance with some embodiments, Integrated circuit layout cell 200 includes a VDD power rail (or power line) 202 at a bottom layer of the integrated circuit, and a plurality of fins 204 extending in a same direction as the VDD power rail 202 in the same layer of the integrated circuit as the VDD power rail 202. Integrated circuit layout cell 200 includes dummy lines (or, cut poly lines) 205 extending in a direction perpendicular to the direction of the VDD power rail 202 and the fins 204, at a layer of the integrated circuit layout cell 200 over the VDD power rail 202 and the fins 204. Integrated circuit layout cell 200 also includes a set of conductive lines (MD lines) 208 extending perpendicular to the VDD power rail 202 and the fins 204. Cross sectional line A-A' extends in parallel to the dummy lines 205 and the conductive lines 208. Integrated circuit layout cell 200 includes signal lines (M0 signal lines, or M0 lines) which extend in parallel with the VDD power rail 202 and the fins 204, and perpendicular to the conductive lines 208. Conductive vias 210 (VB vias) in integrated circuit layout cell 200 electrically connect the VDD power rail 202 (below the conductive vias 210) to the conductive lines 208, and conductive vias 212 (VD vias) electrically connect the conductive lines 208 (below the conductive vias 212) to the M0 signal lines 206 above the conductive vias 212. An etch stop layer 214 is positioned in bands or strips extending parallel to the VDD power rail 202 and the fins 204. The conductive vias 212 between the M0 signal lines 206 and the conductive lines 208 extend through the etch stop layer 214, which electrically isolates the conductive vias 212 from each other, and from other elements in the integrated circuit layout cell 200. Etch stop layer 214 is positioned in the integrated circuit layout cell 200 in order to prevent overetch from the formation of the M0 signal lines from extending into the dielectric material around the conductive lines 208 and causing a short circuit within the integrated circuit.

Figure 2B:
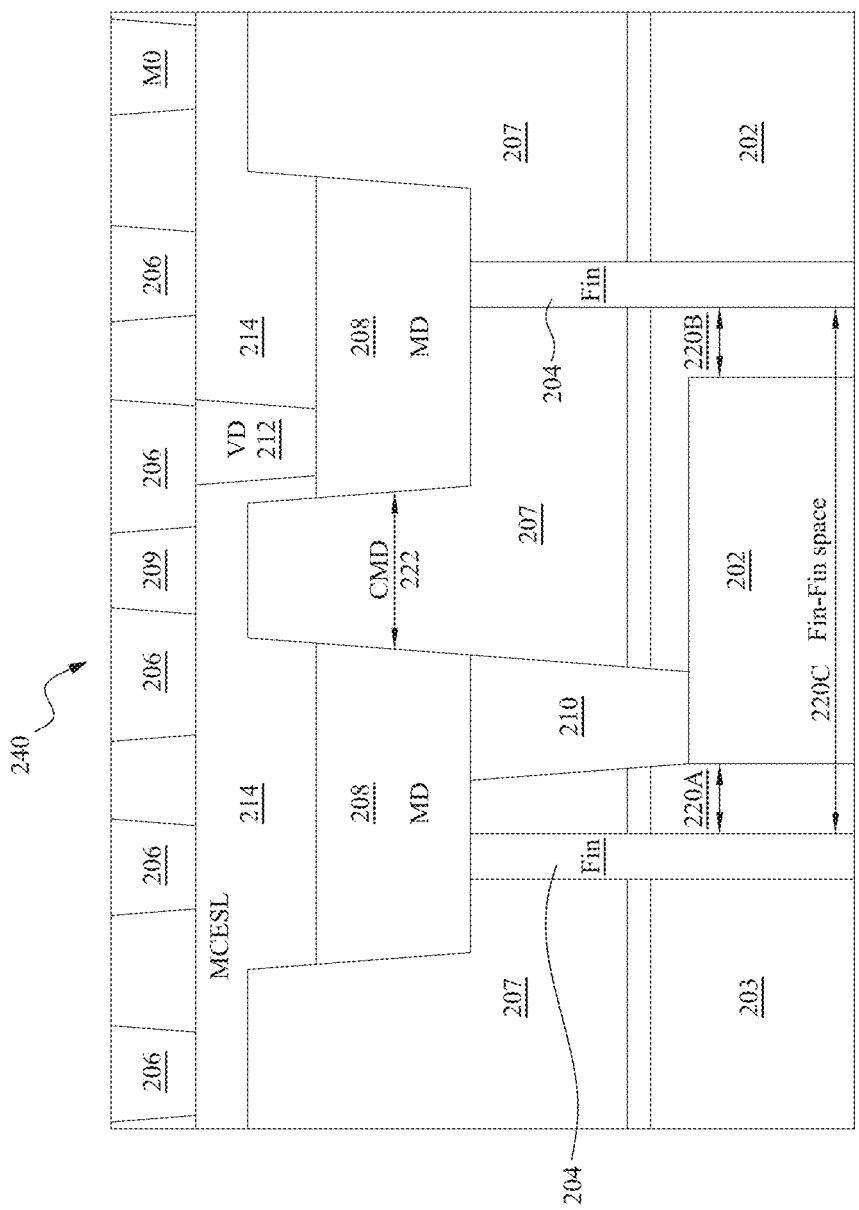
FIG. 2B is a cross-sectional view of the integrated circuit layout cell of FIG. 6A taken along line B-B' in accordance with some embodiments.

FIG. 2B is a cross sectional view of an integrated circuit layout cell 240 corresponding to the view along cross-sectional line A-A' in integrated circuit layout cell 200. Elements of integrated circuit layout cell 240 which have a same structure, composition, and/or function as a corresponding element of integrated circuit layout cell 200 have a same identifying numeral. VDD power rail 202 is shown in cross-section, separated from and between fins 204 of the integrated circuit layout cell 240. In some embodiments, an etch stop or barrier layer 211 is positioned between a first dielectric material 203 and a second dielectric material 207 in order to reduce the amount of metal contamination during etch processes which expose the top surface of the VDD power rail 202 during formation of the opening for a conductive via 210 between the VDD power rail 202 and a conductive line 208. In some embodiments, conductive lines 208 and conductive vias 210 are formed in the second dielectric material 207 using a dual-damascene-type process flow, where one of the contact (via) or the trench (conductive line) is formed during a first iteration of: [1] depositing a layer of patterning material over a top surface of second dielectric material 207, [2] transferring a pattern to the layer of patterning material, [3] etching the second dielectric material through openings in the layer of patterning material corresponding to positions of the contact (via) or trench (conductive line), and [4] removing the layer of patterning material to expose the top surface of the second dielectric material 207 before performing the second iteration of [1] depositing, [2] transferring a pattern, [3] etching the second dielectric material, and [4] removing the layer of patterning material for the other of the contact (via) or trench (conductive line).

In some embodiments, the conductive vias 210 are formed in the second dielectric material 207 by a single iteration of [1] depositing, [2] transferring a pattern, [3] etching the second dielectric material, and [4] removing the layer of patterning material, followed by depositing a conductive contact material (e.g., tungsten, platinum, palladium, cobalt, titanium, titanium nitride, alloys thereof, or other conductive materials suitable for use in low-level contacts in an integrated circuit). The conductive contact material on a top surface of the second dielectric material is then removed by, e.g., chemical mechanical polishing to expose the top surface of the second dielectric material 207 (or, a lower portion thereof) and a top surface of the fins 204 within the second dielectric material. A second portion of second dielectric material is then deposited over the top surface of the fins 204 and the conductive vias 210 and a second iteration of [1] depositing, [2] transferring a pattern, [3] etching the second dielectric material, and [4] removing the layer of patterning material is performed in order to expose a top surface of the fins 204 and the conductive vias 210 to form openings for the conductive lines 208 (MD lines) of the integrated circuit layout cell 240. The openings formed during the second iteration (corresponding to the openings for the conductive lines 208 are then filled with a conductive material to form an electrical connection between a top surface of fins 204 and conductive vias 210 in some portions of the integrated circuit layout cell 240, or part of an interconnection structure for the integrated circuit layout cell 240, and an upper portion of the conductive material deposited into the openings formed in the second iteration is removed by, e.g., wet etching to recess the top surface of the conductive material below a top surface of the second portion of second dielectric material 207 to make space for the etch stop layer 214 to be deposited therein to surround and electrically isolate conductive vias 212 which electrically connect to the top surface of some portions of the conductive lines 208 of the integrated circuit layout cell 240. Conductive lines 208 of the integrated circuit are manufactured by depositing a conductive line material (e.g., tungsten, platinum, palladium, cobalt, titanium, titanium nitride, nickel, alloys thereof, or other conductive materials suitable for use in low-level (front end-of-line, FEOL) conductive lines in an integrated circuit) onto the second dielectric material 207. Conductive line material is deposited by, e.g., sputtering or electroplating the conductive line material onto the surface of the semiconductor wafer to produce a uniform thickness with no voids in the openings for the conductive lines 208, which increases the resistance of the interconnection structure of the integrated circuit.

In integrated circuit layout cell 240, a first separation distance 220A between the VDD power rail 202 and the fin 204 closest to the VDD power rail is configured to provide enough insulation between the power rail and the fin to avoid breakdown of the dielectric material 203 during operation of an integrated circuit manufactured according to the specifications of integrated circuit layout cell 240. Similarly, a separation distance 220B between the VDD power rail (a buried power rail, embedded in the dielectric material below the top level of the fins 204) is sufficiently large on the other side of the VDD power rail 202 to insulate the VDD power rail from the fin on the other side of the power rail. A VDD power rail 202 fits within the fin-fin space having a fin-separation distance 220C (e.g., the fin pitch) of the integrated circuit in proximity to the active area served by the fins 204 in integrated circuit layout cell 240.

A VDD power rail 202 is manufactured in an integrated circuit layout cell 240 by, e.g., [1] depositing a layer of patterning material over the top surface of the dielectric material 203, [2] transferring a pattern to the layer of patterning material having openings therein which correspond to the positions of the VDD power rail 202 between fins of the cell, [3] etching a recess in the layer of dielectric material 203 through the opening in the layer of patterning material, [4] depositing (by, e.g., sputtering) a conductive material into the recess in the layer of dielectric material 203, and, prior removing the layer of patterning material, etching back the layer of conductive material to produce a recessed layer of conductive material (the VDD power rail). The top surface of the VDD power rail thus formed is then covered by, e.g., depositing an additional portion of the first dielectric material. In some embodiments, the addition portion of the first dielectric material is further recessed to expose a top surface of the fins prior to deposition of [1] the etch stop layer (optionally) or [2] the second dielectric material 207 over the fins 204. Conductive material for the VDD power rail is deposited by, e.g., electroplating or sputtering of the conductive material onto a top surface of the semiconductor surface prior to deposition of the second dielectric material. Conductive material for the VDD power rail includes one or more of cobalt, tungsten, titanium, tantalum, platinum, palladium, nickel, alloys thereof, or other conductive materials suitable for the function of a VDD power rail in an integrated circuit.

Figure 3A:
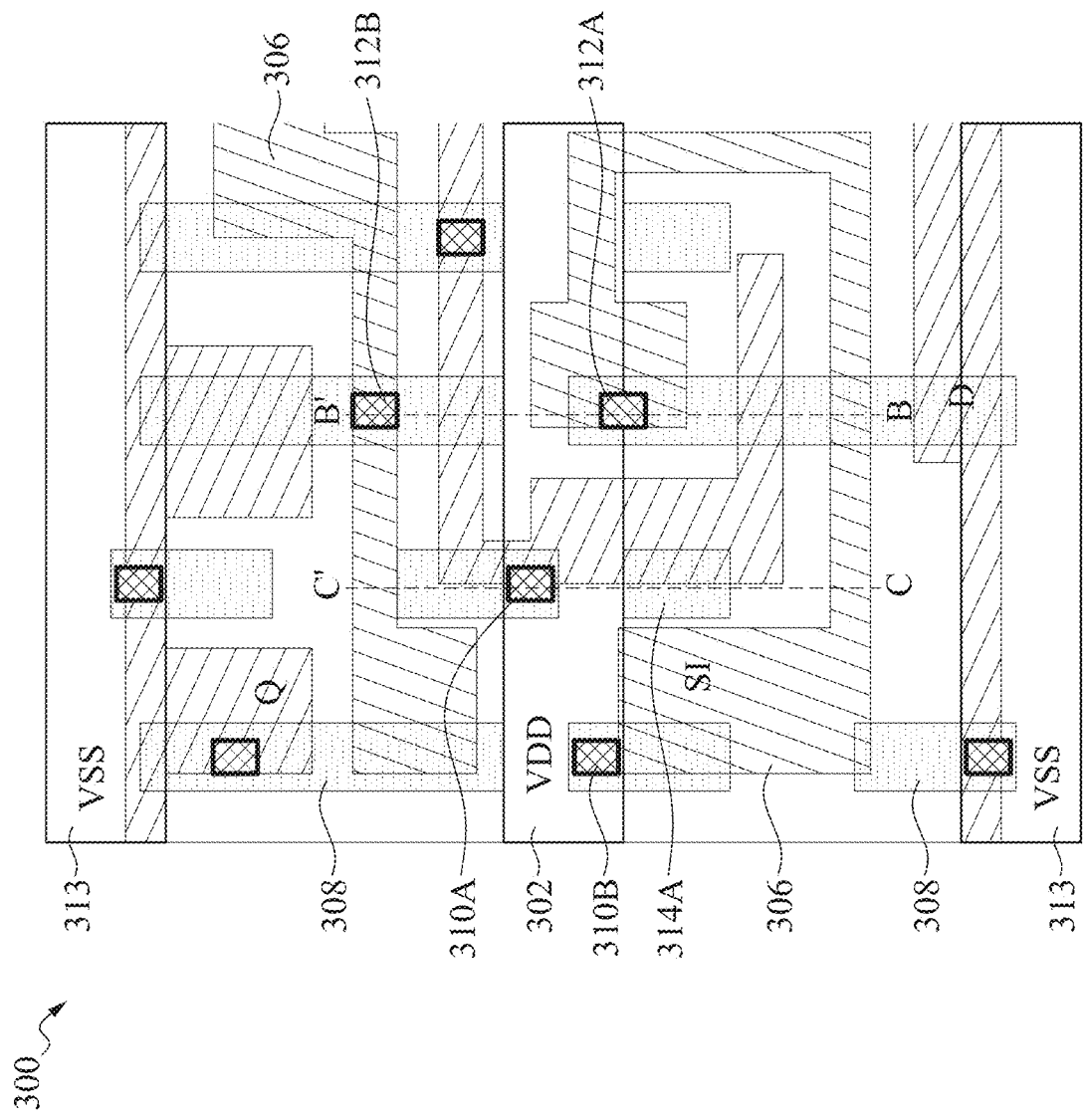
FIG. 3A is a top view of an integrated circuit layout cell in accordance with some embodiments.

FIG. 3A is a top view of an integrated circuit layout cell 300 in accordance with some embodiments. Integrated circuit layout cell 300 includes a metal pattern corresponding to the position and dimensions of the M0 signal lines (the M0 pattern). The M0 pattern is located in the integrated circuit layout cell at a layer above the layer which contains a VDD power rail 302 and VSS rail 304. Elements of the integrated circuit layout cell 300 which have a similar structure, composition, or function as the elements of integrated circuit layout cell 200, described above, have a same identifying numeral, incremented by 100. Integrated circuit layout cell 300 includes VSS rails 313 at top and bottom sides of the cell, extending along the same direction as VDD power rail 302 and the fins in the active areas (not shown in FIG. 3A). In integrated circuit layout cell 300, some conductive contacts 310 electrically connect conductive lines 308 to the VSS rail 313, and some conductive contacts 310 electrically connect other conductive lines 308 to the VDD power rail 302. Conductive vias 312 electrically connect conductive lines 308 to signal lines 306 over the conductive lines 308.

The buried VDD power rail 302 and the VSS rail 313 are positioned in a layer below the active areas of integrated circuit in order to reduce wiring complexity of the integrated circuit. VDD power lines and/or VSS lines traverse large areas of the integrated circuit to provide power to, or receive current form, a large number of active areas of the integrated circuit. Placing the VDD power lines and/or VSS lines above the active areas would introduce additional complexity in routing the M0 signal lines 306. A cross-sectional line B-B' extends across the integrated circuit layout cell 300, with the corresponding a cross-sectional view of integrated circuit layout cell 340, shown in FIG. 3B and described in further detail below. Cross-sectional line B-B' extends through two conductive vias 312A and 312B between M0 signal lines and MD conductive lines in the integrated circuit layout cell 300. A cross-sectional line C-C' extends across the integrated circuit layout cell 300, running parallel to the cross-sectional line B-B', and includes a single conductive via 310A (a VB via) between a buried VDD power rail 302 and the "adjacent" M0 signal lines 306 in the layer over the conductive via 310A. In integrated circuit layout cell 300, the conductive vias 310A-310B, and 312A-312B, are laterally smaller (in both the direction along the length of the VDD power rail, and the direction perpendicular to the length of the VDD power rail) than the conductive lines 308 to which the contacts connect. Because the etch stop layer 314 (not shown) between the conductive lines 308 and the M0 signal lines 306) shares the lateral dimensions of the conductive lines 308 in the regions around the conductive vias 312A-312B (or, all conductive vias between conductive lines 308 and the M0 signal lines 306, the conductive vias 312 are also laterally surrounded (in both the direction along the length of the VDD power rail, and the direction perpendicular to the length of the VDD power rail) by the etch stop material of the etch stop layer 314 (not shown, but see FIGS. 3B and 3C).

Figure 3B:
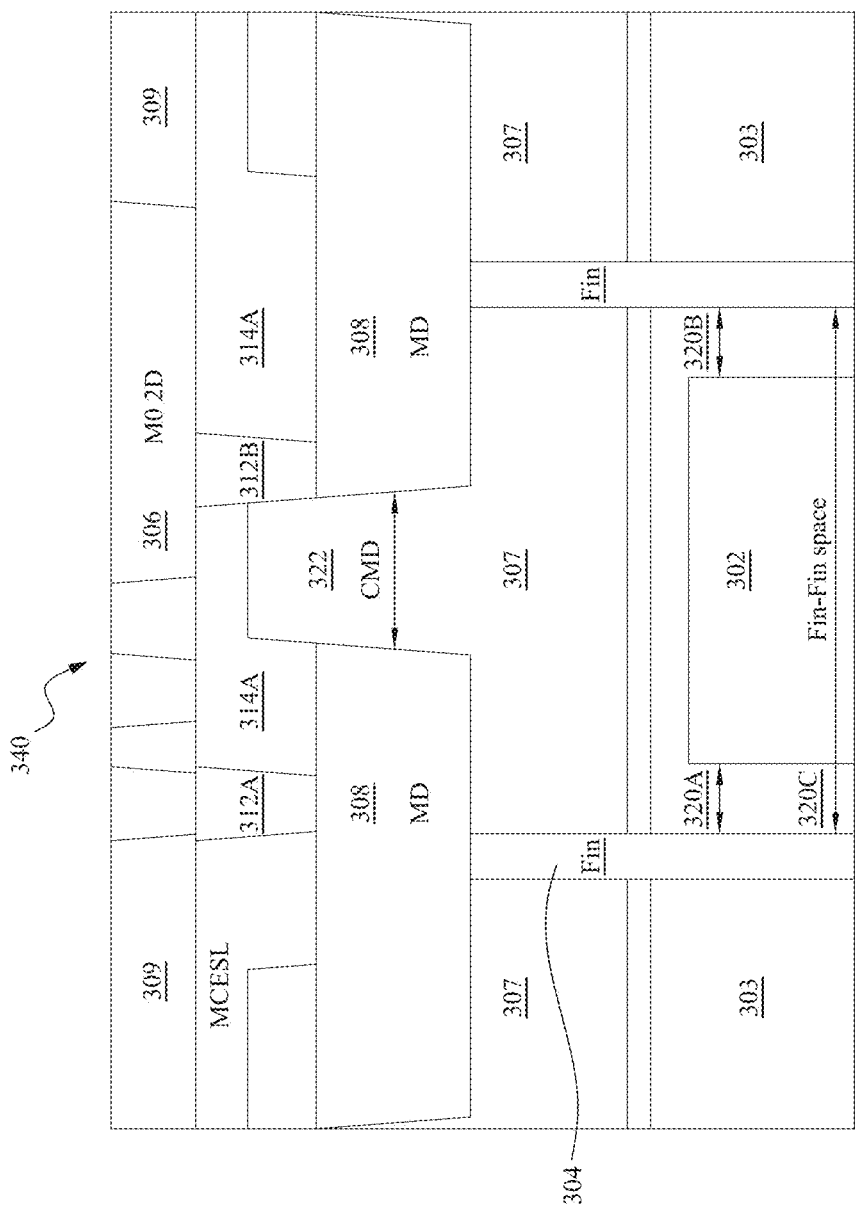
FIG. 3B is a cross-sectional view of the integrated circuit layout cell of FIG. 3A taken along line B-B' in accordance with some embodiments.
Figure 3C:
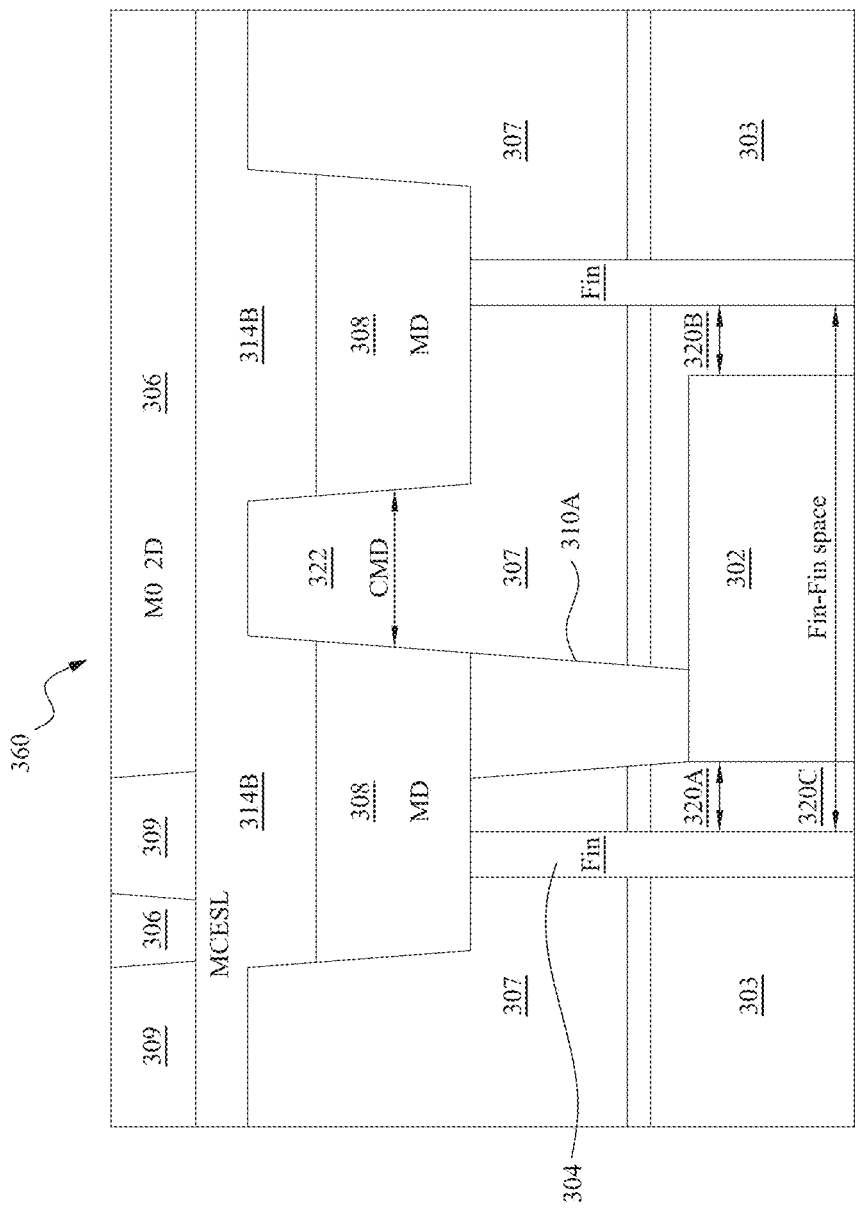
FIG. 3C is a cross-sectional view of the integrated circuit layout cell of FIG. 3A taken along line C-C' in accordance with some embodiments.

FIG. 3B is a cross-sectional view of the integrated circuit layout cell 340, in accordance with some embodiments. In FIG. 3B, the conductive vias 312A and 312B electrically connect conductive lines 308 to M0 signal lines 306 in the third dielectric material 309. FIG. 3C is a cross-sectional view of the integrated circuit layout cell 360, in accordance with some embodiments. In FIG. 3C, the conductive via 310A electrically connects a conductive line 308 to the power rail 302 while maintaining a separation distance 320A between the conductive contact 310A and the power rail 302 from the closest fin 304 which extends through second dielectric material 307 and first dielectric material 303.

FIGS. 4A-E are top views of a Litho-Spacer-Litho-Etch (LSLE) manufacturing sequence using A and B patterns in accordance with some embodiments, and FIGS. 5A-5E are top views of a two-dimensional (2D) AB color stitching manufacturing sequence using A and B patterns in accordance with some embodiments. The A and B patterns correspond to different mask sets, or color groups, and the manufacturing sequence illustrated in FIGS. 4A-4E is usable to form subsets of M0 segments corresponding to the A and B patterns and having a minimum spacing, e.g., satisfying a minimum spacing rule. The manufacturing sequence illustrated in FIGS. 5A-5E is usable to apply one or more color stitching regions to electrically connect a M0 segment of the subset corresponding to the A pattern to a M0 segment of the subset corresponding to the B pattern, subsets that would otherwise be electrically isolated from each other.

Figure 4A:
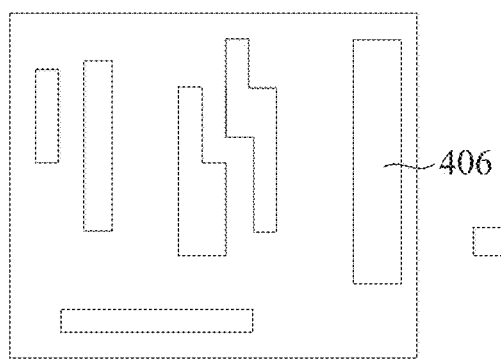
FIGS. 4A-E are top views of a Litho-Spacer-Litho-Etch (LSLE) manufacturing sequence using A and B patterns in accordance with some embodiments.
Figure 4B:
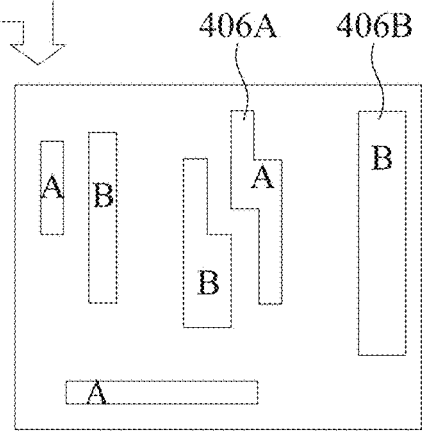
Figure 4C:
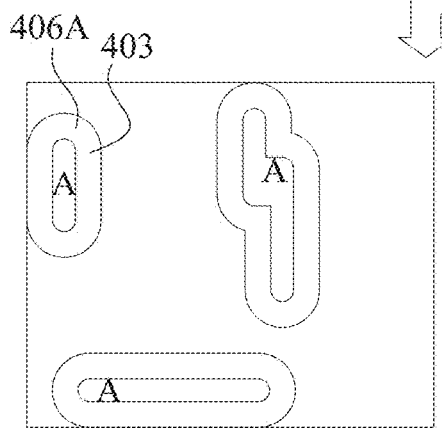
Figure 4D:
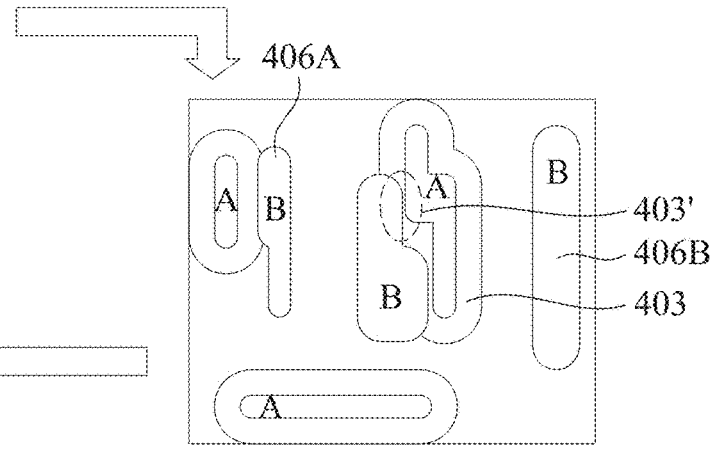
Figure 4E:
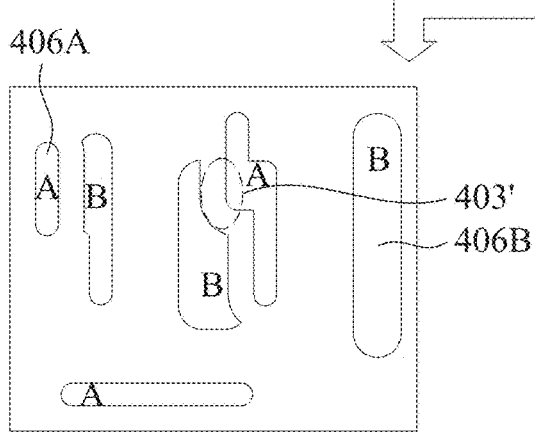

FIG. 4A illustrates the metal layer design layout including conductive elements 406 (only one labeled for clarity) corresponding to M0 regions 114 discussed above with respect to FIG. 1, according to some embodiments. In some embodiments, the pattern of FIG. 4A is divided into partial patterns including conductive elements 406A corresponding to the pattern A and conductive elements 406B corresponding to the pattern B (only one of each labeled for clarity) of FIG. 4B that are sequentially patterned. FIG. 4C illustrates the pattern and etching of the first of the sequential partial patterns, pattern A, in which conductive element 406A is formed, followed by the formation of a sidewall structure 403 around the periphery of conductive element 406A. The next of the sequential partial patterns, pattern B, including conductive element 406B, is then patterned and etched over both the existing conductive element 406A of pattern A and the sidewall structure 403 as shown in FIG. 4D. The sidewall structure 403 is then removed to leave the combined metal pattern 406A/406B corresponding to the conductive elements 406 as shown in FIG. 4A. As shown in FIGS. 4D and 4E, in some embodiments the sidewall structure 403 is sized and configured to maintain at least a minimum spacing between adjacent conductive elements 406A, 406B. In instances in which the minimum spacing is not maintained between the pattern A and Pattern B elements, the sidewall structure 403 prevents formation of that portion of pattern B 406B that overlaps the sidewall structure 403 in region 403' of FIG. 4D, thereby maintaining the minimum spacing as illustrated in, for example, the corresponding region 403' of FIG. 4E after removing the sidewall structure 403.

Figure 5A:
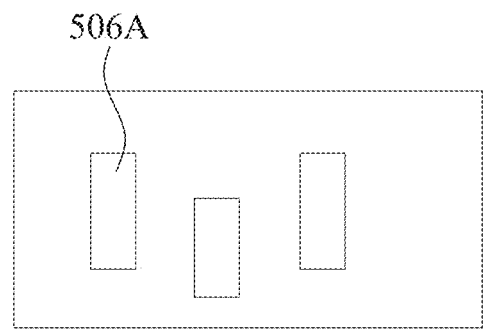
FIGS. 5A-E are top views of a two-dimensional (2D) AB color stitching manufacturing sequence using A and B patterns in accordance with some embodiments.
Figure 5B:
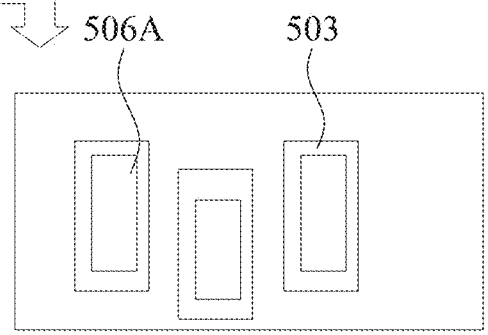
Figure 5C:
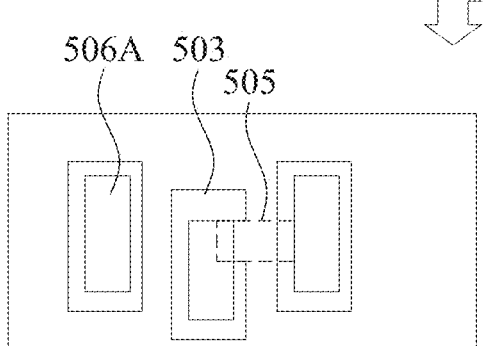
Figure 5D:
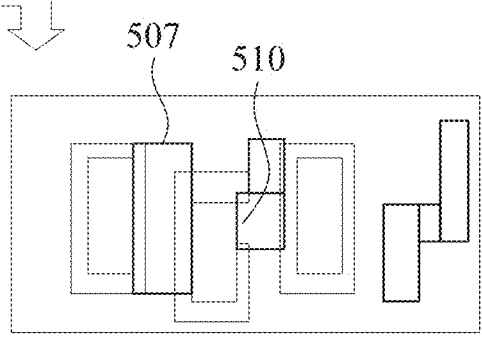
Figure 5E:
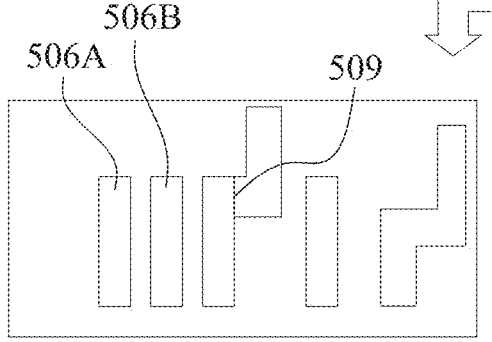

FIG. 5A illustrates the patterning and etching of the first of a series of sequential partial patterns, pattern A, by which conductive elements 506A (only one labeled for clarity) are formed, followed by the formation of sidewall structures 503 (only one labeled for clarity) around the peripheries of conductive elements 506A as shown in FIG. 5B. According to some embodiments, an intermediate pattern 505 is then formed and a portion of one sidewall structure 503 is removed to expose a stitch region or portion 510 of pattern A. The next of the sequential partial patterns, pattern B including conductive elements 507 (only one labeled for clarity) is then patterned over both the existing conductive elements 506A of pattern A and the residual portions of the sidewall structures 503 as shown in FIG. 5D. After pattern B conductive elements 506B are etched, the combined metal pattern includes both distinct pattern A conductive elements 506A and pattern B conductive elements 506B as well as a combined conductive element 509 with conductive elements from both pattern A and pattern B in direct electrical contact at the "stitch" region in which the portion of the sidewall structure 503 was removed. The combination conductive element 509 as shown in FIG. 5E comprises elements of both pattern A and pattern B that have been "stitched" together at the point where the portion of the sidewall structure 503 was previously removed to expose a portion of a conductive element 506A of pattern A.

Figure 6A:
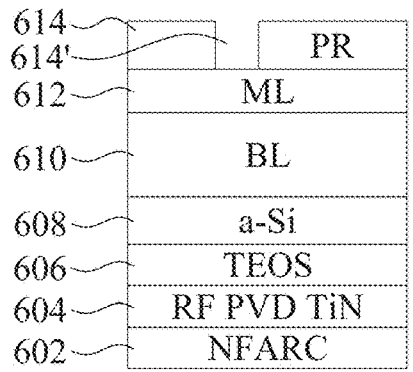
FIGS. 6A-N are sequential views of a manufacturing process using A and B stitching connect conductive patterns in accordance with some embodiments.
Figure 6B:
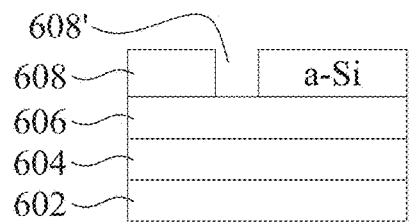
Figure 6C:
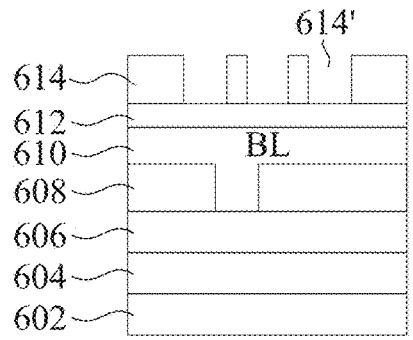
Figure 6D:
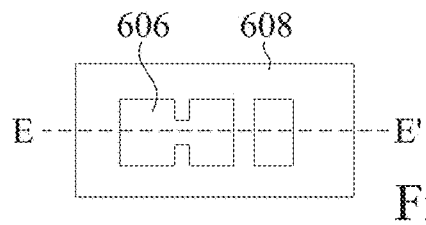
Figure 6E:
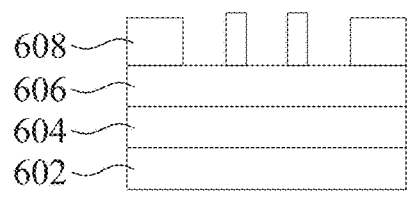
Figure 6F:
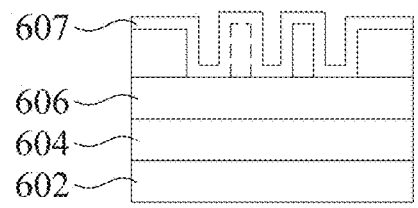
Figure 6G:
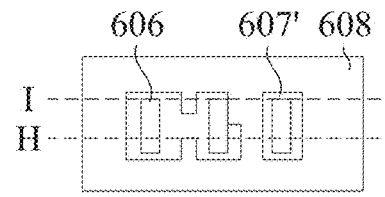
Figure 6H:
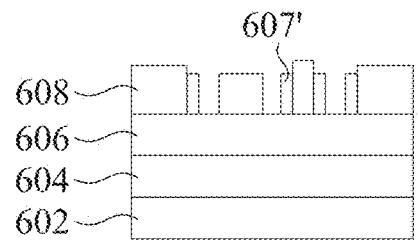
Figure 6I:
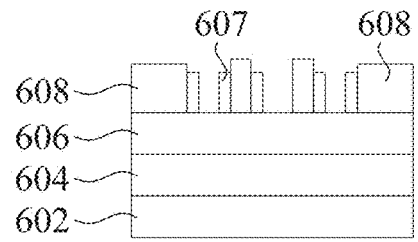
Figure 6J:
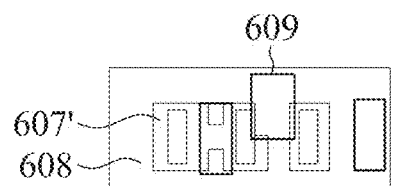
Figure 6K:
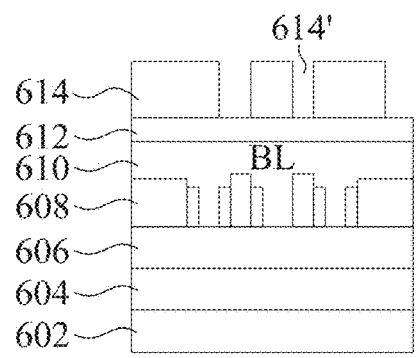
Figure 6L:
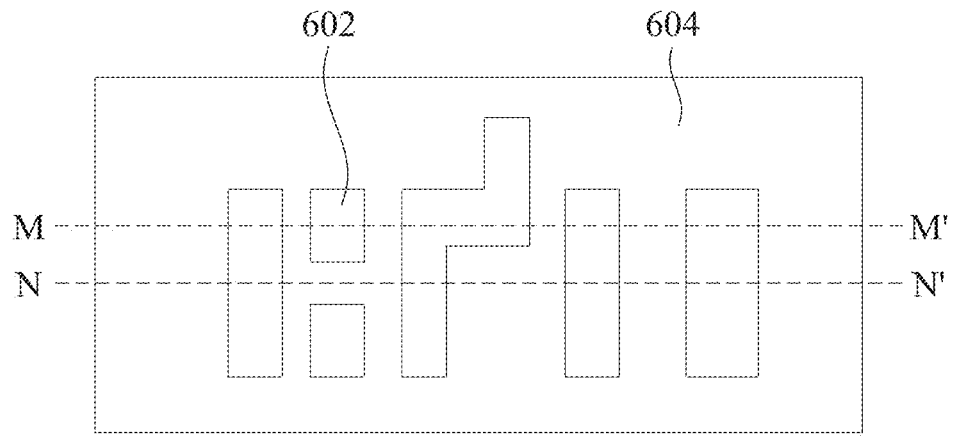
Figure 6M:
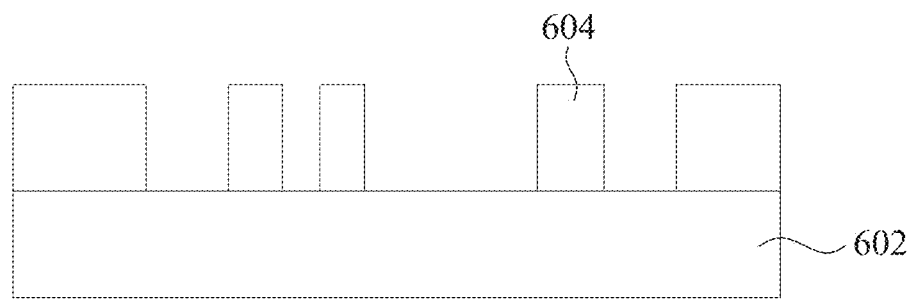
Figure 6N:
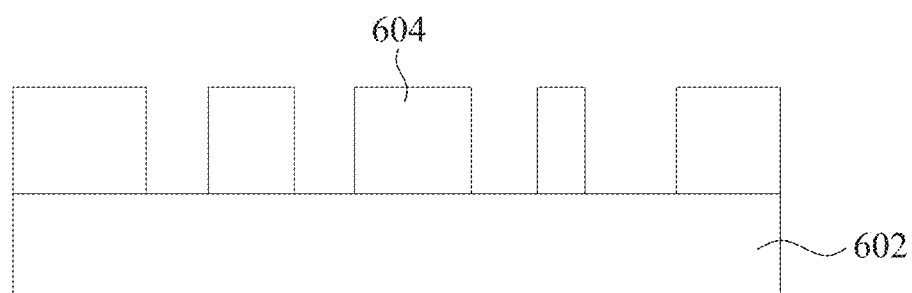

FIGS. 6A-N are sequential views of a manufacturing process using A and B stitching-connect patterns in accordance with some embodiments.

FIG. 6A is a cross-sectional view of a stack of films during embodiments of the manufacturing process, which includes a nitrogen-free anti-reflective coating (NFARC) layer 602, a metal layer 604, an dielectric layer or insulating layer, e.g., a tetraethyl orthosilicate (TEOS) derived oxide layer, 606, an amorphous silicon layer (a-Si) 608, temporary layers 610 and 612, and a photoresist layer 614, in which an opening 614' is patterned. Temporary layer 610 is, in some embodiments, a bonding layer configured to provide separation between the alpha-silicon layer 608 and the temporary layer 612 (a mask layer). A bonding layer is used in some manufacturing processes to improve adhesion between photoresist and substrates, to provide a uniform separation between the top surface of the substrate on which the photoresist (layer 614) is applied and the pattern source (e.g., a DUV photolithography tool, an electron beam tool, or some other pattern generating source). When working with small dimensions, a correct focus across the surface of the integrated circuit allows for improved dimensional control for the pattern elements being transferred to the layer of patterning material 614 on the top surface of the film stack. Focal errors introduce avoidable dimensional variability and sometimes lead to non-functional devices after a manufacturing process because elements which are intended to be separated according to an integrated circuit layout, are too close to each other, or elements which are supposed to be connected are, in fact, separated from each other due to pattern misalignment in double or multiple patterning manufacturing processes.

FIG. 6B describes an opening 608' formed in the alpha silicon layer 608, formed after an etch process removes a portion of the alpha-silicon layer 608 exposed through opening 614' in the layer of patterning material 614 after exposing the top surface of the alpha-silicon layer 608, and subsequent to removing the temporary layers 610, 612, and the layer of patterning material 614.

FIG. 6C shows the addition of new temporary layers 610, 612 and a second photoresist pattern 614 in which are patterned as described above, to form a series of openings 614', which after etching and removal of the intermediate layers exposes regions of the oxide layer 606 through openings 608' formed in the a-Si layer 608 to produce a top view corresponding to, e.g., FIG. 6D. A cross-section of FIG. 6D taken along line E-E' shown in FIG. 6E.

FIG. 6F shows the addition of sidewall layer 607 to the residual portions of the a-Si layer 608. According to some embodiments, the sidewall layer is a layer of dielectric material such as silicon nitride, silicon oxy-nitride, and so forth), which is deposited conformally over an exposed surface of the top of the alpha-silicon layer 608, the inner sidewalls of the openings in alpha-silicon layer 608, and the exposed top surface of the oxide layer 606. The sidewall layer 607 is then subjected to further processing using, for example, etch back processes, chemical-mechanical planarization (CMP) processes, and/or other suitable processes to remove an upper portion of the sidewall layer 607 to obtain sidewall structures 607', wherein the horizontal surfaces of the layer of alpha-silicon layer 608 and the oxide layer 606 are exposed, while the portions of the sidewall material (e.g., dielectric material) on the vertical sides of the alpha-silicon layer remain behind to laterally separate the silicon sidewall from other openings to be formed in the alpha-silicon layer (except where the stitching process occurs to remove a portion of the sidewall material to allow material deposited around the sidewall material to electrically connect with the alpha-silicon material (e.g., "stitching" together the portions of alpha-silicon and the other, later-deposited material (a second portion of alpha-silicon, or some other electrically conductive material deposited into the opening between the outer surface of the sidewall material in the openings in the alpha-silicon layer 608).

FIG. 6L shows a top view of the conductive structures remaining after the etch and removal of the photoresist, intermediate structures, a-Si, and TEOS layers. FIGS. 6M and 6N are cross-sectional views corresponding to views taken along the lines M-M' and N-N' as shown in FIG. 6L after formation of the metal interconnect pattern reflecting the residual metal, i.e., the remaining portion of the metal layer 604 that forms the metal interconnect pattern. The underlying TEOS layer 606 and metal layers 604 are etched using the hard mask that is formed by etching the a-Si 608 and forming the sidewall structures 607'. The sidewall structures 607', the residual a-Si 608, and residual TEOS layer 606, are then removed to obtain the metal interconnect pattern.

Figure 7:
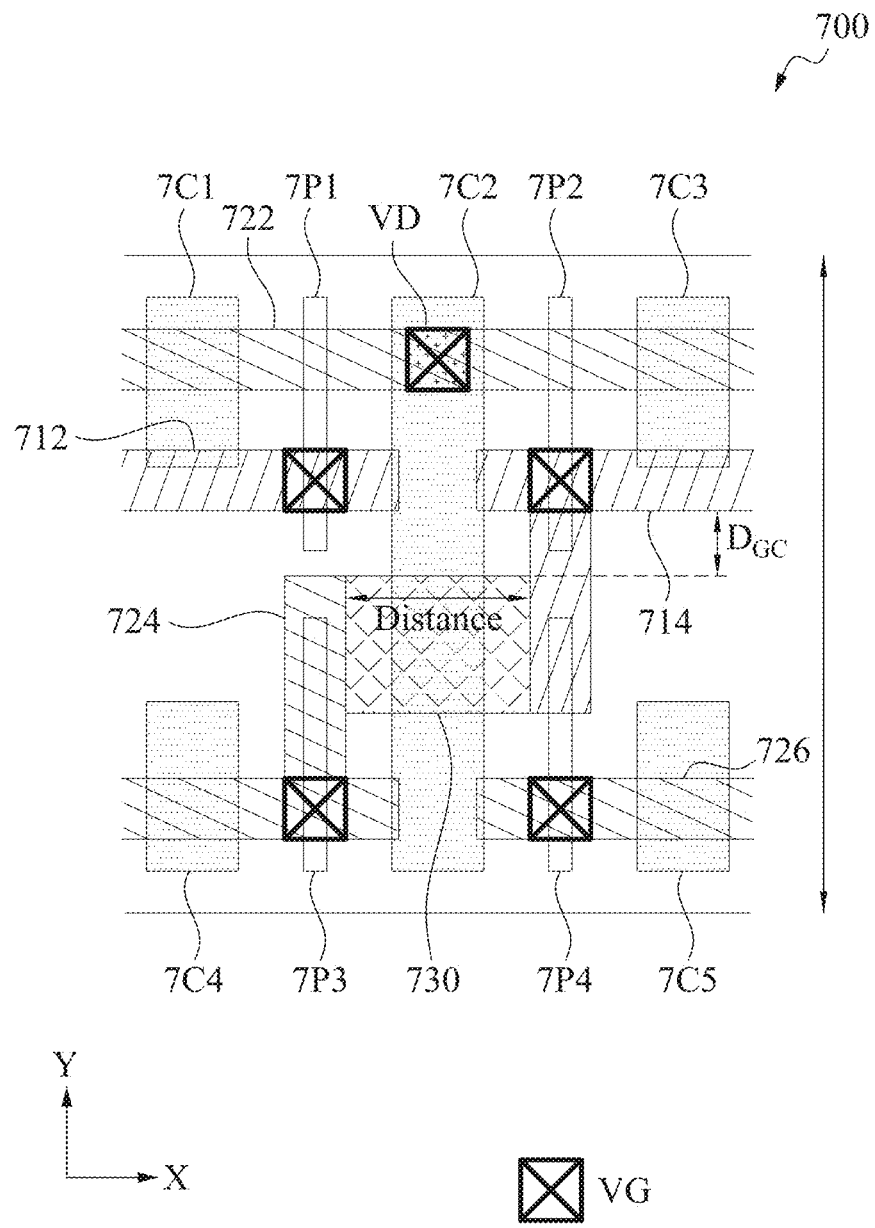
FIG. 7 is a portion of a layout diagram of a cell having a color stitching region, in accordance with some embodiments.

FIG. 7 is a portion of a layout diagram of a cell 700 having a color stitching region, in accordance with some embodiments. The cell 700 includes a plurality of first routing tracks (e.g., 712 and 714) assigned to a first color group of the layout. The cell 700 also includes a plurality of second routing tracks (e.g., 722, 724, and 726) assigned to a second color group of the layout. In various embodiments, the term "routing track" refers to either a conductive region, e.g., a M0 region 114 discussed above with respect to FIG. 1, or to a grid line in an IC layout diagram used to align conductive regions, e.g., M0 regions 114. In FIG. 7, the first routing track 712 is between the adjacent second routing tracks 722 and 724, and the first routing track 714 is between the adjacent second routing tracks 722 and 726. While the first routing track 712 is a one-dimensional routing track extending in the X-direction, the first routing track 714 is an irregular polygonal routing track. While each of the second routing tracks 722 and 726 is a one-dimensional routing track extending in the X-direction and forms, the second routing track 724 is an irregular polygonal routing track.

The cell 700 includes a color stitching region 730 connecting the first routing track 714 with the second routing track 724. The color stitching region 730 represents a conductive region that connects a first conductive element represented by the first routing track 714 with a second conductive element represented by the second routing track 724 through an exposed portion of the first routing track 714. The exposed portion is at a removed portion of a sidewall structure surrounding the first routing track 714. In the embodiment as shown in FIGS. 5A-5E, after a portion of the sidewall structure 503 surrounding the conductive element represented by the pattern 506A is removed, and the conductive element represented by the pattern 506A is conductively connected to the conductive element represented by the pattern 506B through the conductive region represented by the intermediate pattern 505.

The cell 700 includes multiple gate-strips (represented by gate-strip patterns 7P1, 7P2, 7P3, and 7P4) extending in the Y-direction and multiple conductive segments (represented by conductive patterns 7C1, 7C2, 7C3, 7C4, and 7C5) extending in the Y-direction. One or more gate-strips (represented by gate-strip patterns 7P1, 7P2, 7P3, and 7P4) are connected to the gates of the transistors in the cell 700. One or more conductive segments (represented by conductor patterns 7C1, 7C2, 7C3, 7C4, and 7C5) are connected to the sources or the drains of the transistors in the cell 700. In the device fabricated having the cell 700, the first routing track 712 in the first color group is conductively connected to the gate-strips 7P1 though one of the vias VG. The first routing track 714 in the first color group is conductively connected to the gate-strips 7P2 though one of the vias VG. The second routing track 722 in the second color group is conductively connected to conductive segment 7C2 though a via VD. The second routing track 724 in the second color group is conductively connected to the gate-strips 7P3 though one of the vias VG. The second routing track 726 in the second color group is conductively connected to the gate-strips 7P4 though one of the vias VG.

In FIG. 7, the connection from the first conductive element represented by the first routing track 714 to the second conductive element represented by the second routing track 724 (through the conductive region represented by the color stitching region 730) involves right-angle turnings. Because corner rounding at the right-angle turnings is reduced when the conductive region represented by the color stitching region 730 is used for the conductive connection, the distance DGC between the color stitching region 730 and the first routing track 714 in the first color group for connecting to the gate-strip 7P2 is minimized.

Figure 8:
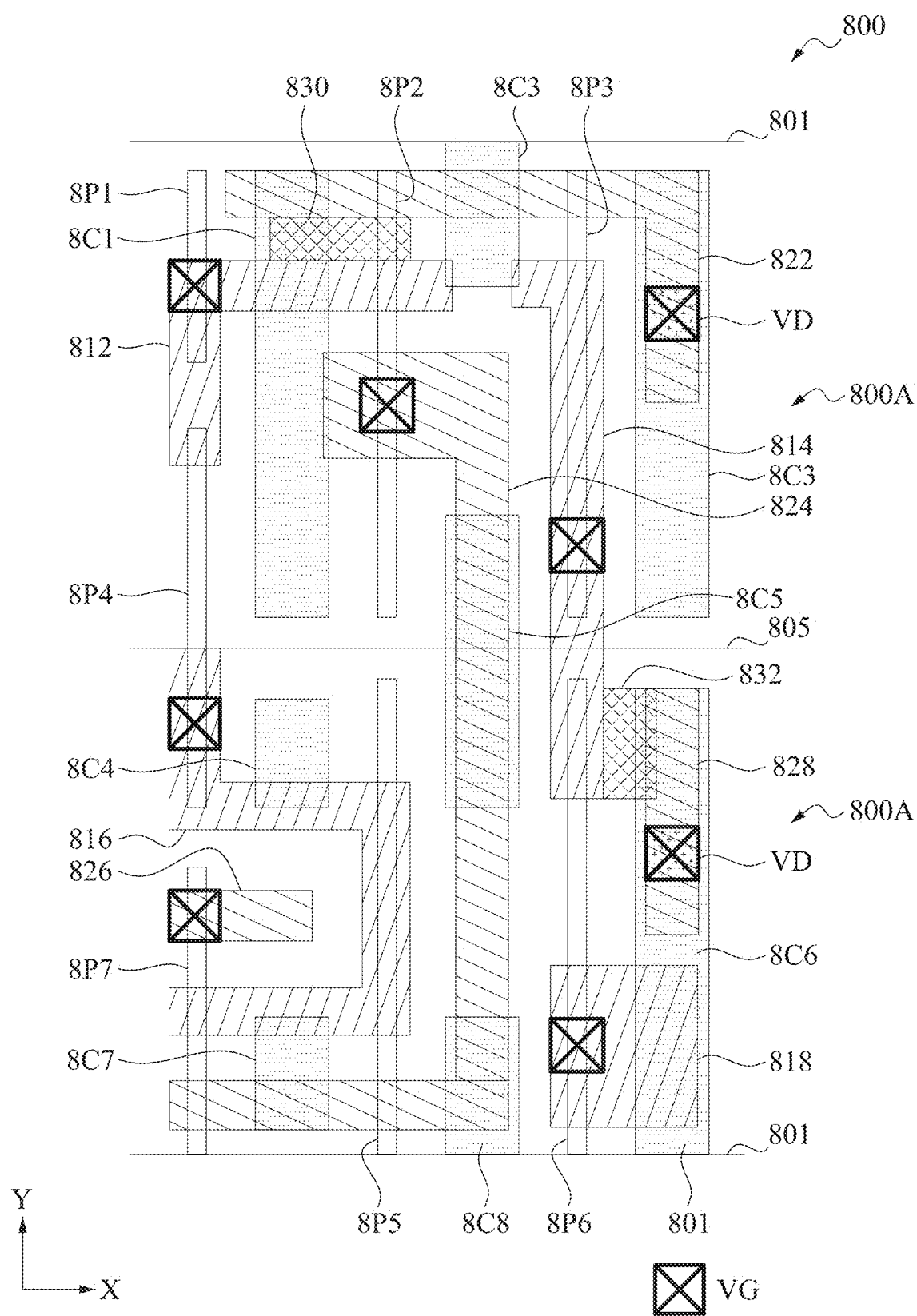
FIG. 8 is a portion of a layout diagram of a double-height cell having a color stitching region, in accordance with some embodiments.

FIG. 8 is a portion of a layout diagram of a double-height cell having a color stitching region, in accordance with some embodiments. The cell 800 includes a plurality of first routing tracks (e.g., 812, 814, 816, and 818) assigned to a first color group of the layout. The cell 800 also includes a plurality of second routing tracks (e.g., 822, 824, 826, and 828) assigned to a second color group of the layout. The first routing tracks (e.g., 812, 814, 816, and 818) of the first color group are interleaved with the second routing tracks (e.g., 822, 824, 826, and 828) of the second color group. The cell 800 includes multiple gate-strips (represented by gate-strip patterns 8P1-8P7) extending in the Y-direction and multiple conductive segments (represented by conductive patterns 8C1-8C8) extending in the Y-direction.

In the device fabricated having the cell 800, each of the first routing tracks (e.g., 812, 814, 816, and 818) of the first color group is conductively connected to a corresponding gate-strip (e.g., 8P1, 8P3, 8P4, and 8P6) through one of the vias VG. The second routing track 824 of the second color group is conductively connected to the gate-strip 8P2. The second routing tracks 822 and 828 of the second color group are correspondingly connected to a corresponding a conductive segments represented by one of the conductor patterns 8C2 and 8C6.

In FIG. 8, the cell 800 has two cell two cell boundaries 801 and 802 both extending in the X-direction. A middle line 805 extending in the X-direction at an equal distance to each of the two cell boundaries 801 and 802 separates the cell 800 into a first half 800A and a second half 800B. Each of the first half 800A and the second half 800B has a height that is a half of the height of the double-height cell 800. The first routing track 814 of the first color group and the second routing track 824 of the second color group extends from the first half 800A of the double-height cell to the second half 800B of the double-height cell.

The cell 800 includes a color stitching region 830 connecting the first routing track 812 of the first color group with the second routing track 822 of the second color group. The color stitching region 830 represents a conductive region that connects a first conductive element represented by the first routing track 812 with a second conductive element represented by the second routing track 822 through an exposed portion of the first routing track 812. The exposed portion is at a removed portion of a sidewall structure surrounding the first routing track 812. The cell 800 includes a color stitching region 832 connecting the first routing track 814 of the first color group with the second routing track 828 of the second color group. The color stitching region 832 represents a conductive region that connects a first conductive element represented by the first routing track 814 with a second conductive element represented by the second routing track 828 through an exposed portion of the first routing track 814. The exposed portion is at a removed portion of a sidewall structure surrounding the first routing track 814.

Figure 9A:
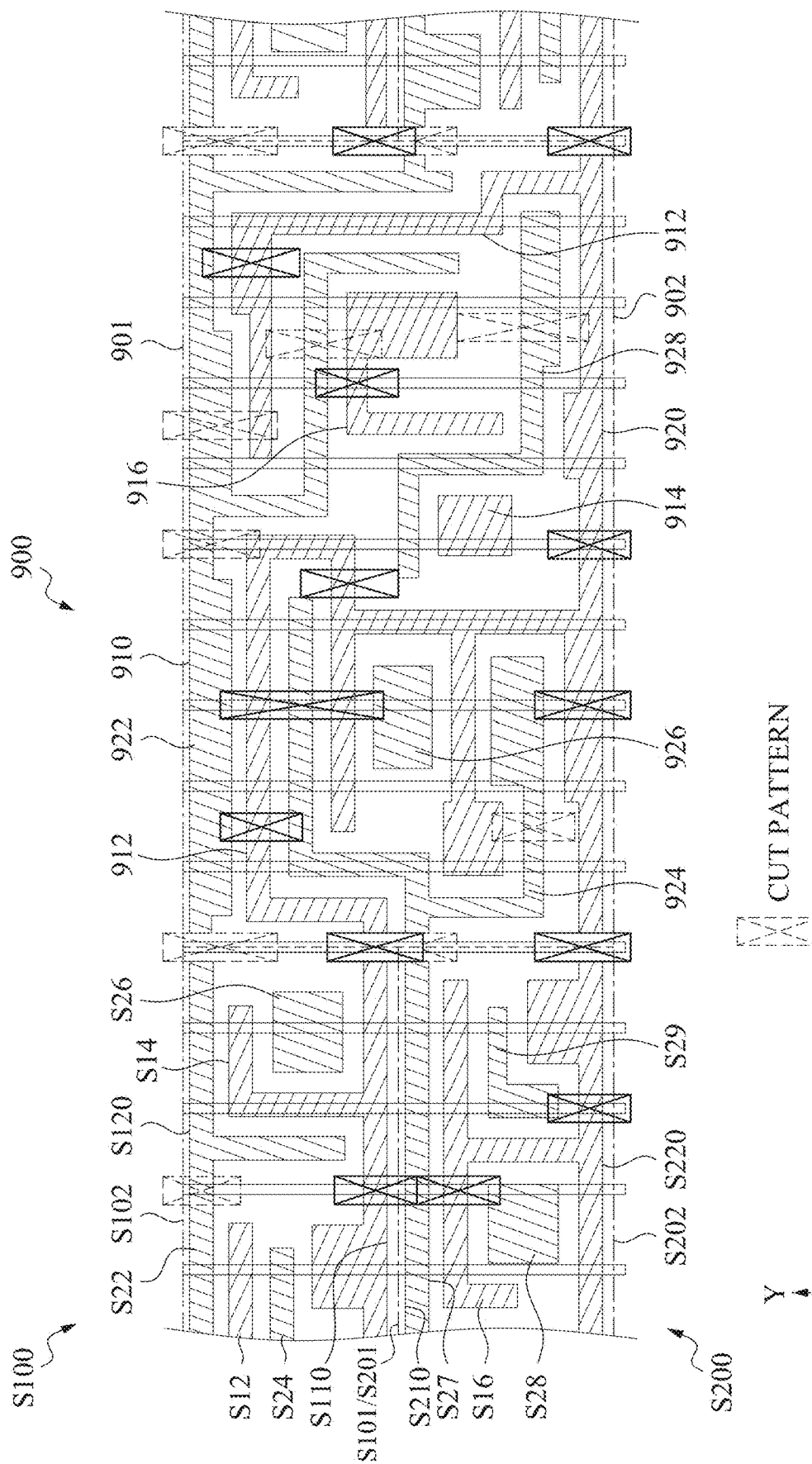
FIG. 9A is a portion of a layout diagram having two single-height cells and a double-height cell 900, in accordance with some embodiments.

FIG. 9A is a portion of a layout diagram having two single-height cells (e.g., S100 & S200) and a double-height cell 900, in accordance with some embodiments. The single-height cell S100 includes a first boundary S101 and a second boundary S102 both extending in the X-direction. The first boundary S101 and the second boundary S102 are on opposite sides of the single-height cell S100. The single-height cell S200 includes a first boundary S201 and a second boundary S202 both extending in the X-direction. The first boundary S201 and the second boundary S202 are on opposite sides of the single-height cell S200. The first boundary S101 of the first cell S100 and the first boundary S201 of the second cell S200 are aligned with each other to form a common boundary that separates the first cell S100 from the second cell S200.

The single-height cell S100 includes first routing tracks S12 and S14 assigned to the first color group of the layout. The single-height cell S100 includes second routing tracks S22, S24, and S26 assigned to the second color group of the layout. The conductor corresponding to the first routing tracks S14 is broken into two segments according to the cut pattern on the first routing tracks S14. The conductor corresponding to the second routing tracks S22 is broken into two segments according to the cut pattern on the second routing tracks S22. Each of the first routing track S14 and the second routing track S22 is an irregular polygonal routing track. A run-side S110 of the first routing tracks S14 is positioned next to the first boundary S101 and in parallel with the first boundary S101. A run-side S120 of the second routing tracks S22 is positioned next to the second boundary S102 and in parallel with the second boundary S102.

The single-height cell S200 includes first routing track S16 assigned to the first color group of the layout. The single-height cell S200 includes second routing tracks S27, S28, and S29 assigned to the second color group of the layout. The conductor corresponding to the first routing tracks S16 is broken into three segments according to the two cut patterns on the first routing tracks S16. The first routing tracks S16 is an irregular polygonal routing track. A run-side S210 of the second routing tracks S27 is positioned next to the first boundary S201 and in parallel with the first boundary S201. A run-side S220 of the first routing tracks S16 is positioned next to the second boundary S202 and in parallel with the second boundary S202. Additionally, because the second routing tracks S27 and the first routing tracks S16 are assigned to different color groups, the run-side S210 of the second routing tracks S27 and the run-side S220 of the first routing tracks S16 are positioned at minimal separation along the Y-direction.

The double-height cell 900 includes a first boundary 901 and a second boundary 902 both extending in the X-direction. The first boundary 901 and the second boundary 902 are on opposite sides of the double-height cell 900. The first boundary 901 and the second boundary 902 are separated by a distance (along the Y-direction) that is equal to a double cell distance (along the Y-direction) between the second boundary S102 of the single-height cell S100 and the second boundary S202 of the single-height cell S200.

The double-height cell 900 includes first routing tracks 912, 914, and 916 assigned to the first color group of the layout. The double-height cell 900 includes second routing tracks 922, 924, 926, and 928 assigned to the second color group of the layout. The conductor corresponding to the first routing tracks 912 is broken into multiple segments according to multiple cut patterns placed on the first routing track 912. The conductor corresponding to the first routing track 916 is broken into two segments according to the cut pattern placed on the first routing track 916. The conductor corresponding to the second routing tracks 922 is broken into multiple segments according to multiple cut patterns placed on the second routing track 922. The conductor corresponding to the second routing track 924 is broken into two segments according to the cut pattern placed on the second routing track 924. The conductor corresponding to the second routing track 928 is broken into two segments according to the cut pattern placed on the second routing track 928. Some of the first routing tracks (e.g., 912 and 916) and the second routing tracks (e.g., 922, 924, and 928) are irregular polygonal routing tracks.

In FIG. 9A, a run-side 910 of the second routing track 922 is positioned next to the first cell boundary 901 and in parallel with the first cell boundary 901. A run-side 920 of the first routing track 912 is positioned next to the second cell boundary 902 and in parallel with the cell second boundary 902. When the double-height cell 900 is viewed as to include two hypothetical parts, each being a half of the double-height cell 900, divided by a hypothetical middle line (e.g., similar to a middle line 805 in FIG. 8) extending in the X-direction at an equal distance to each of the two cell boundaries 901 and 902, some of the routing tracks extend from one half of the double-height cell 900 to the other half of the double-height cell. For example, each of the first routing tracks 912 and 916 extends from one half of the double-height cell 900 to the other half of the double-height cell 900. As another example, each of the second routing tracks 922 and 924 extends from one half of the double-height cell 900 to the other half of the double-height cell 900.

Figure 9B:
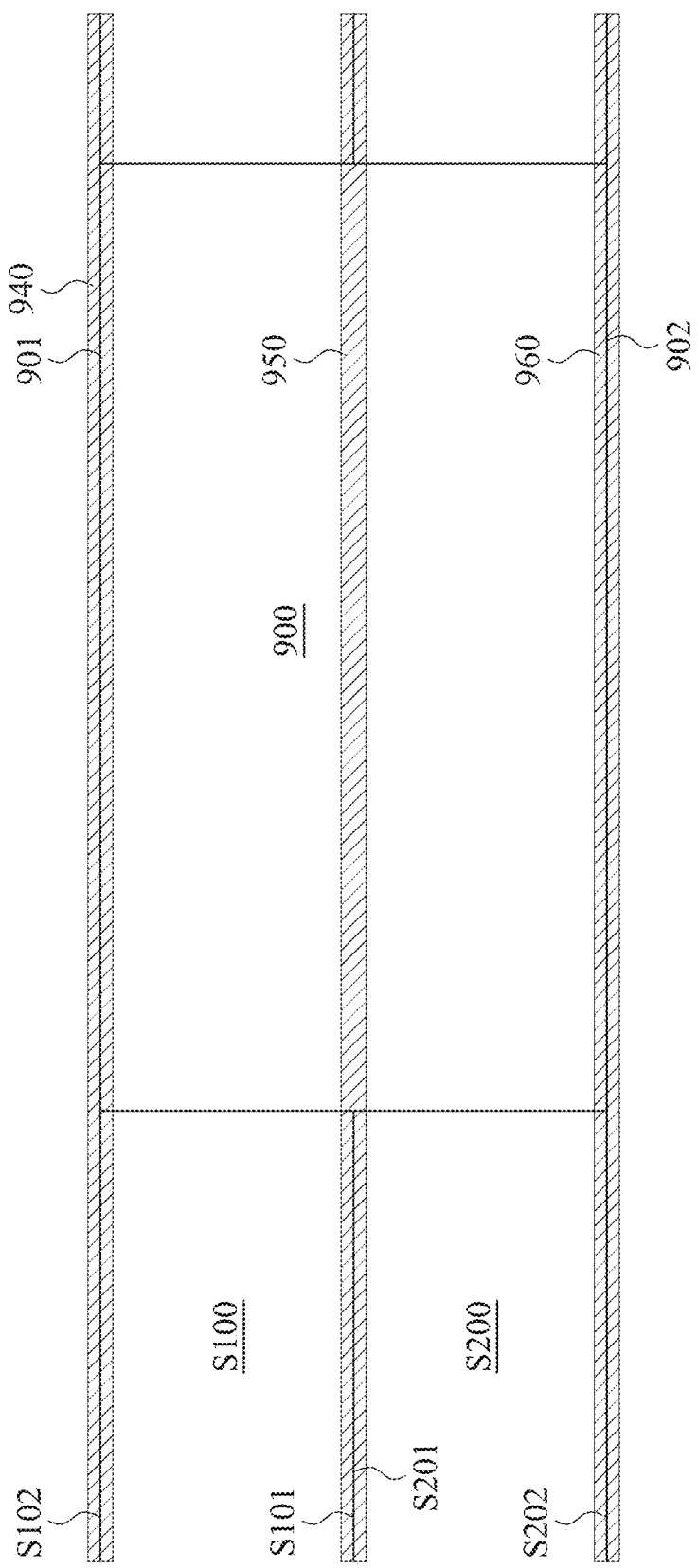
FIG. 9B is a portion of a layout diagram having buried power lines, in accordance with some embodiments.

FIG. 9B is a portion of a layout diagram having buried power lines, in accordance with some embodiments. In FIG. 9B, buried power lines 940, 950, and 960, extending in the X-direction, are positioned with an identical pitch distance between neighboring buried power lines. The first boundary S101 of the single-height cell S100 and the first boundary S201 of the single-height cell S200 are correspondingly aligned with the buried power line 950. The second boundary S102 of the single-height cell S100 and the second boundary S202 of the single-height cell S200 are correspondingly aligned with the buried power lines 940 and 960. The first boundary 901 and the second boundary 902 of the double-height cell 900 are correspondingly aligned with the buried power lines 940 and 960. In a device fabricated according to the layout diagram of FIG. 9B, the buried power line 950 is underneath the double-height cell 900 and passes through the double-height cell 900 at an equal distance to each of the two cell boundaries 901 and 902.

In some embodiments, each of the buried power lines 940 and 960 underneath the double-height cell 900 is configured to have the supply voltage VDD, while the buried power line 950 underneath the double-height cell 900 is configured to have the supply voltage VSS. In some embodiments, each of the buried power lines 940 and 960 underneath the double-height cell 900 is configured to have the supply voltage VSS, while the buried power line 950 underneath the double-height cell 900 is configured to have the supply voltage VDD.

In FIG. 9A and FIG. 9B, the double-height cell 900 is adjacent to the single-height cells S100 and S200 and share a boundary extending in the Y-direction. In alternative embodiments, the double-height cell 900 is separated from the single-height cells S100 and S200, and the double-height cell 900 does no share a boundary extending in the Y-direction.

Figure 10:
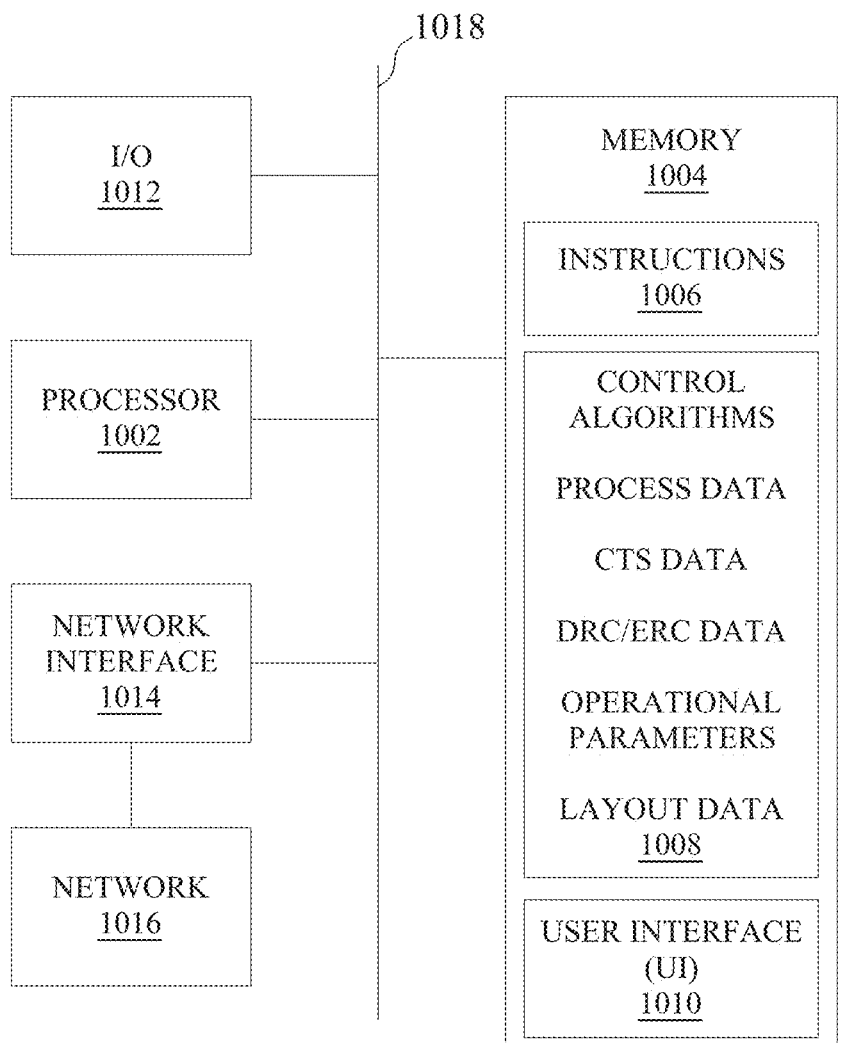
FIG. 10 is a schematic view of an electronic process control (EPC) system useful in the operation of an IC design layout modification in accordance with some embodiments.

FIG. 10 is a block diagram of an electronic process control (EPC) system 1000, in accordance with some embodiments. Methods described herein of generating cell layout diagrams, in accordance with one or more embodiments, are implementable, for example, using EPC system 1000, in accordance with some embodiments. In some embodiments, EPC system 1000 is a general purpose computing device including a hardware processor 1002 and a non-transitory, computer-readable storage medium 1004. Storage medium 1004, amongst other things, is encoded with, i.e., stores, computer program code (or instructions) 1006, i.e., a set of executable instructions. Execution of computer program code 1006 by hardware processor 1002 represents (at least in part) an EPC tool which implements a portion, or all, of the methods described herein in accordance with one or more embodiments (hereinafter, the noted processes and/or methods).

Hardware processor 1002 is electrically coupled to computer-readable storage medium 1004 via a bus 1018. Hardware processor 1002 is also electrically coupled to an I/O interface 1012 by bus 1018. A network interface 1014 is also electrically connected to hardware processor 1002 via bus 1018. Network interface 1014 is connected to a network 1016, so that hardware processor 1002 and computer-readable storage medium/memory 1004 are capable of connecting to external elements via network 1016. Hardware processor 1002 is configured to execute computer program code 1006 encoded in computer-readable storage medium 1004 in order to cause EPC system 1000 to be usable for performing a portion or all of the noted processes and/or methods. In one or more embodiments, hardware processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause EPC system 1000 (where such execution represents (at least in part) the EPC tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores process control data 1008 including, in some embodiments, control algorithms, active area data, transition cell data, uniformity algorithms, layout data, and constants, target ranges, set points, and code for enabling statistical process control (SPC) and/or model predictive control (MPC) based control of the various processes.

EPC system 1000 includes I/O interface 1012. I/O interface 1012 is coupled to external circuitry. In one or more embodiments, I/O interface 1012 includes a keyboard, keypad, mouse, trackball, trackpad, touchscreen, and/or cursor direction keys for communicating information and commands to hardware processor 1002.

EPC system 1000 also includes network interface 1014 coupled to hardware processor 1002. Network interface 1014 allows EPC system 1000 to communicate with network 1016, to which one or more other computer systems are connected. Network interface 1014 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 1000.

EPC system 1000 is configured to receive information through I/O interface 1012. The information received through I/O interface 1012 includes one or more of instructions, data, design rules, process performance histories, target ranges, set points, and/or other parameters for processing by hardware processor 1002. The information is transferred to hardware processor 1002 via bus 1018. EPC system 1000 is configured to receive information related to a user interface (UI) through I/O interface 1012. The information is stored in computer-readable medium 1004 as user interface (UI) 1010.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 1000.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
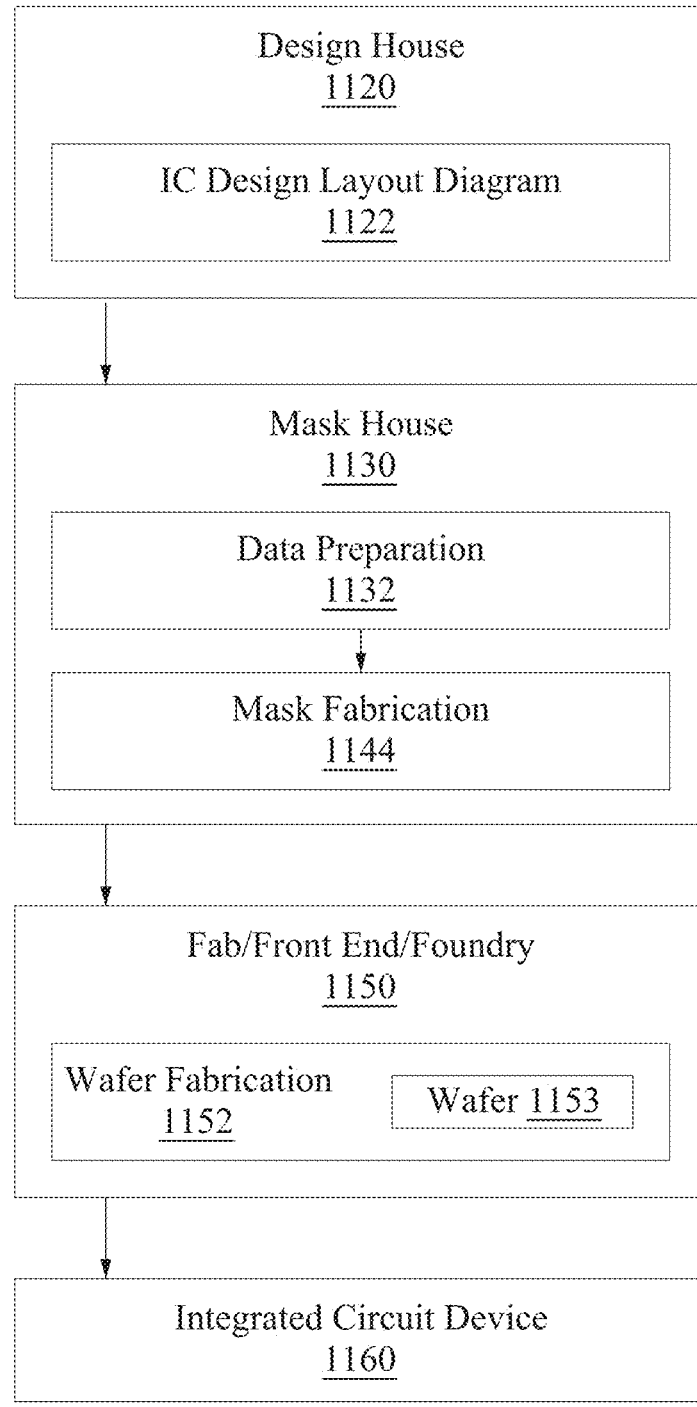
FIG. 11 is a flow diagram of a manufacturing process for an integrated circuit in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator (FAB or fab) 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 is be expressed in a GDSII file format or DFII file format, according to some embodiments.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 are collectively referred to as mask data preparation.

In some embodiments, mask data preparation 1132 includes optical proximity correction (OPC) which uses lithography enhancement techniques to compensate for image errors, such as those that arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which undoes part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. In some embodiments, the processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

One of ordinary skill in the art would understand that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 is executed in a variety of different orders, according to some embodiments.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. In some embodiments, mask 1145 is formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask is attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes wafer fabrication 1152. IC fab 1150 is an IC fabrication business that includes one or more manufacturing facilities for the fabrication of a variety of different IC products. In some embodiments, IC Fab 1150 is a semiconductor foundry. For example, according to some embodiments, a manufacturing facility for the front end fabrication of a plurality of IC products (front-end-of-line (FEOL) fabrication), while a second manufacturing facility is provided the back end fabrication for the interconnection and packaging of the IC products (back-end-of-line (BEOL) fabrication), and a third manufacturing facility is provided other services for the foundry business.

In some embodiments of the present disclosure, fin dimensional adjustment includes operations associated with making an array of fins across an entirety of the fin-containing functional areas of the integrated circuit, followed by modification of fin dimensions in at least one fin-containing functional area of the integrated circuit. In some embodiments of the present disclosure, the fins of different fin-containing functional areas are formed to a final fin shape or fin dimensional profile separately, in a single fin-formation manufacturing flow for each fin-containing functional area of the IC. In some embodiments, the fin dimension adjustment occurs by forming fins in a layer of fin material, or fin substrate, by applying mask layer to a top surface of the fin material, patterning the mask layer with a pattern that corresponds to the locations of fins in one or more of the fin-containing functional areas, exposing a top surface of the fin material through the mask layer, and etching the fin material to form fins in the fin substrate. In some embodiments, the fins are formed in a single functional area of the IC with a final fin dimension, the selected fin dimension (or, fin height) as described above in IC fab 1150.

A patterned layer of mask material formed on a semiconductor substrate is made of a mask material that includes one or more layers of photoresist, polyimide, silicon oxide, silicon nitride (e.g., $Si_3N_4$), SiON, SiC, SiOC, or combinations thereof. In some embodiments, masks include a single layer of mask material. In some embodiments, a mask includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, fins of areas not covered by the mask, or fins in open areas of the pattern, are etched to modify a fin dimension. In some embodiments, the etching is performed on a top surface of fins with fin sides that are completely covered by adjoining dielectric support material deposited between fins in a previous manufacturing step. Etching of top surfaces of fins is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof. In some embodiments, etching the fins is performed by exposing an upper portion of fin material, extending above a top surface of a dielectric support medium deposited between fins and recessed below a top surface of the fin height in a prior manufacturing step, to a liquid chemical etch solution comprising one or more of the liquid chemical etchants described above. An upper portion of the fin material includes a top surface and sides of the fin material.

In some embodiments, the etching process is a dry-etch or plasma etch process. Plasma etching of a substrate material is performed using halogen-containing reactive gasses excited by an electromagnetic field to dissociate into ions. Reactive or etchant gases include $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed fin material by alternating electromagnetic fields or by fixed bias according to methods of plasma etching that are known in the art.

In some embodiments, etching processes include presenting the exposed portions of fins of the functional area in an oxygen-containing atmosphere to oxidize an outer portion of the fin material, followed by a chemical trimming process such as plasma-etching or liquid chemical etching, as described above, to remove the oxidized semiconductor fin material and leave a modified fin behind. In some embodiments, fin oxidation followed by chemical trimming is performed to provide greater selectivity to the fin material and to reduce a likelihood of accidental fin material removal during a manufacturing process. In some embodiments, the exposed portions of fins of the functional area are top surfaces of the fins, the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Pub. No. 20150278429, published Oct. 1, 2015, U.S. Pre-Grant Pub. No. 20140040838, published Feb. 6, 2014, and U.S. Pat. No. 7,260,442, granted Aug. 21, 2007, each of which are hereby incorporated, in their entireties, by reference.

Figure 12:
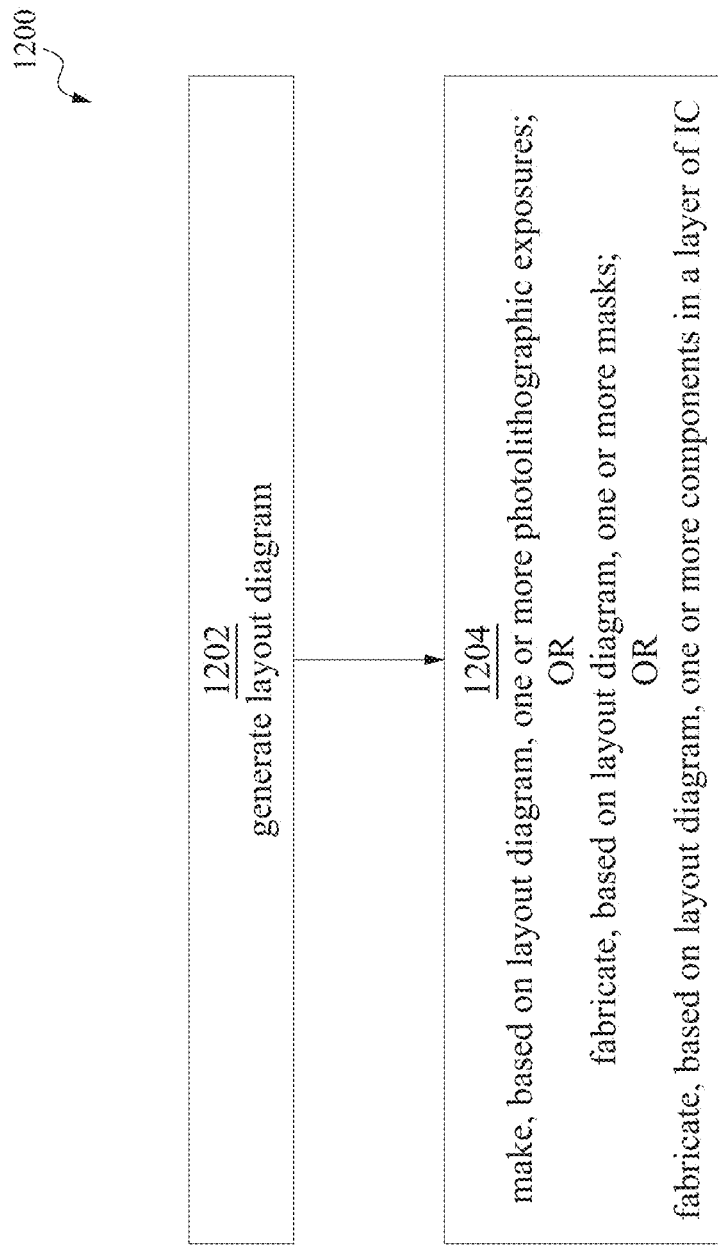
FIG. 12 is a flowchart of a method of generating a layout diagram, in accordance with some embodiments.

FIG. 12 is a flowchart of a method 1200 of generating a layout diagram, in accordance with some embodiments.

Method 1200 is implementable, for example, using EDA system 1000 (FIG. 10, discussed above) and integrated circuit (IC), manufacturing system 1100 (FIG. 11, discussed above), in accordance with some embodiments. Regarding block 1202, examples of the layout diagrams which generated according to block 1202 include layout diagrams (e.g., 700, 800, and 900), or the like. Examples of a semiconductor device which can be manufactured based on layout diagrams generated according to block 1202 include the semiconductor device in FIGS. 2B, 3B and 3C, and semiconductor devices based on layout diagrams (e.g., FIGS. 2A, 3A, 7, 8, 9A and 9B), or the like.

Method 1200 includes blocks 1202-1204. At block 1202, a layout diagram is generated. An example of a semiconductor device corresponding to a layout generated by method 1200 includes IC layout diagram 100 of FIG. 1. Block 1202 is discussed in more detail below with respect to FIG. 6A. From block 1202, flow proceeds to block 1204.

At block 1204, based on the layout diagram, at least one of (A) one or more photolithographic exposures are made or (B) one or more semiconductor masks are fabricated or (C) one or more components in a layer of a semiconductor device are fabricated. See discussion above of FIG. 10.

Figure 13:
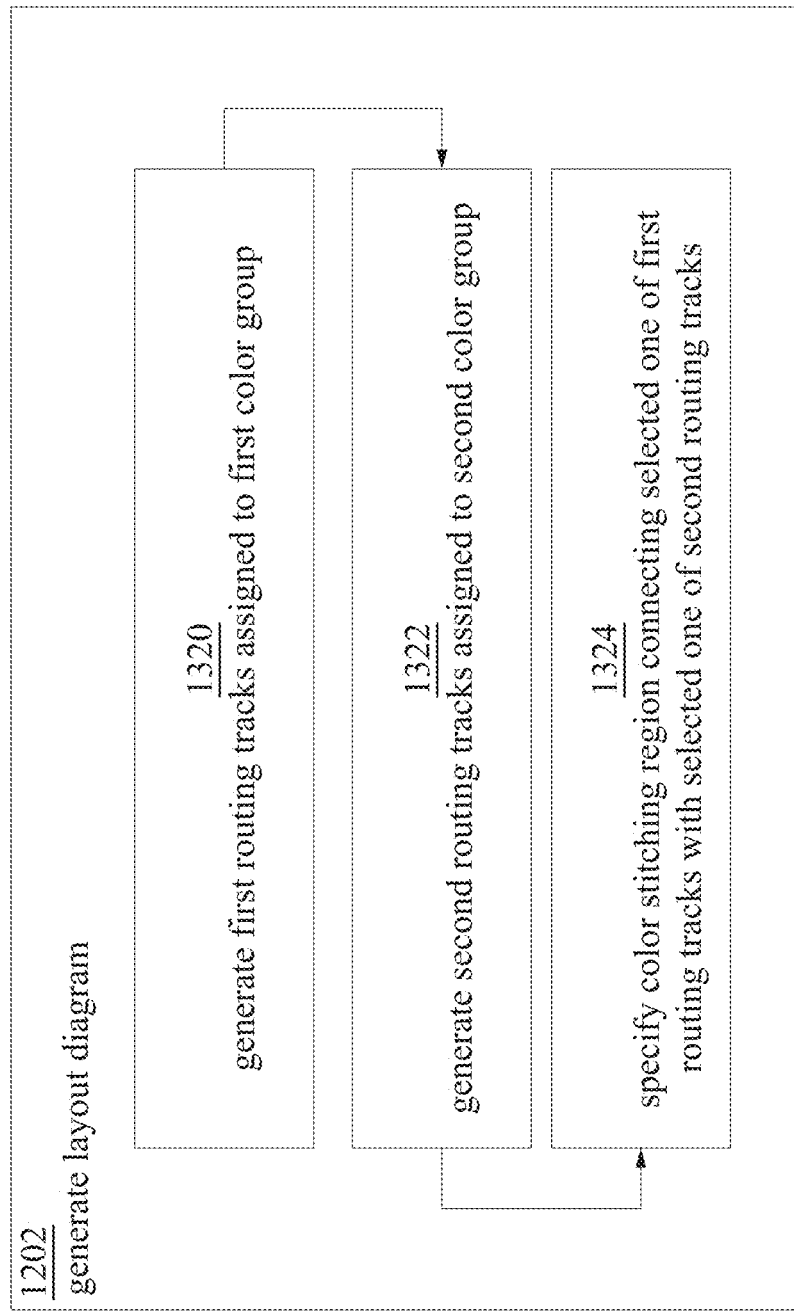
FIGS. 13-14 are corresponding flowcharts of corresponding methods of generating a layout diagram, in accordance with some embodiments.
Figure 14:
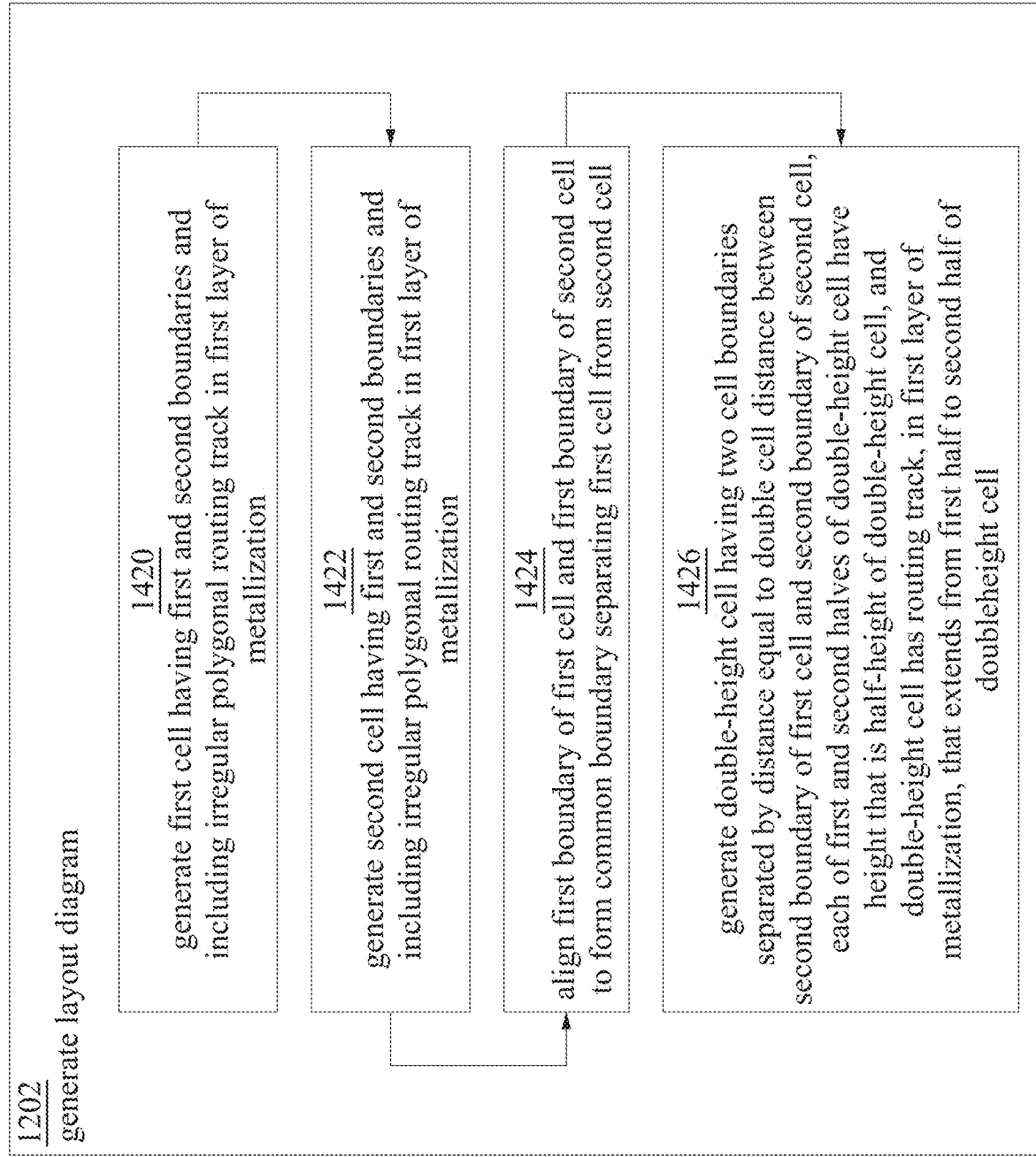

FIGS. 13-14 are corresponding flowcharts of a method of generating a layout diagram, in accordance with some embodiments.

More particularly, the flowcharts of corresponding FIGS. 13-14 shows additional blocks included in block 1202 of FIG. 12, in accordance with one or more embodiments.

In FIG. 13, block 1202 includes blocks 1320-1324. At block 1320, first routing tracks are generated which are assigned to a first color group. Examples of the first routing tracks include 912, 914, and 916 in FIG. 9. From block 1320, flow proceeds to block 1322.

At block 1322, second routing tracks are generated which are assigned to a second color group. Examples of the second routing tracks include 922, 924, 926, and 928 in FIG. 9. From block 1322, flow proceeds to block 1324.

At block 1324, a color stitching region is specified which connects a selected one of first routing tracks with a selected one of second routing tracks. An example of the color stitching region is 730 in FIG. 7. An example of the selected one of the first routing tracks is 714 in FIG. 7. An example of the selected one of the second routing tracks is 724 in FIG. 7.

In FIG. 14, block 1202 includes blocks 1420-1426. At block 1420, a first cell is generated which has first and second boundaries and includes an irregular polygonal routing track in a first layer of metallization. An example of the first cell is S100 in FIG. 9. An example of the irregular polygonal routing track in the first cell is S14 in FIG. 9. From block 1420, flow proceeds to block 1422.

At block 1422, a second cell is generated which has first and second boundaries and includes an irregular polygonal routing track in the first layer of metallization. An example of the second cell is S200 in FIG. 9. An example of the irregular polygonal routing track in the second cell is S16 in FIG. 9. From block 1422, flow proceeds to block 1424.

At block 1424, the first boundary of the first cell and the first boundary of second cell are aligned to form a common boundary separating the first cell from the second cell. An example of the common boundary formed by having aligned the first boundary of the first cell and the first boundary of second cell is S101/S201 in FIG. 9. From block 1424, flow proceeds to block 1426.

At block 1426, a double-height cell is generated which has two cell boundaries separated by distance equal to double cell distance between second boundary of first cell and second boundary of second cell, wherein each of the first and second halves of the double-height cell has a height that is a half of the height of double-height cell, and the double-height cell has a routing track, in first layer of metallization, that extends from the first half to second half of the double-height cell. An example of the double height cell is 900 in FIG. 9. An example of the routing track, in first layer of metallization, that extends from the first half to second half of the double-height cell is 912 in FIG. 9

Figure 15:
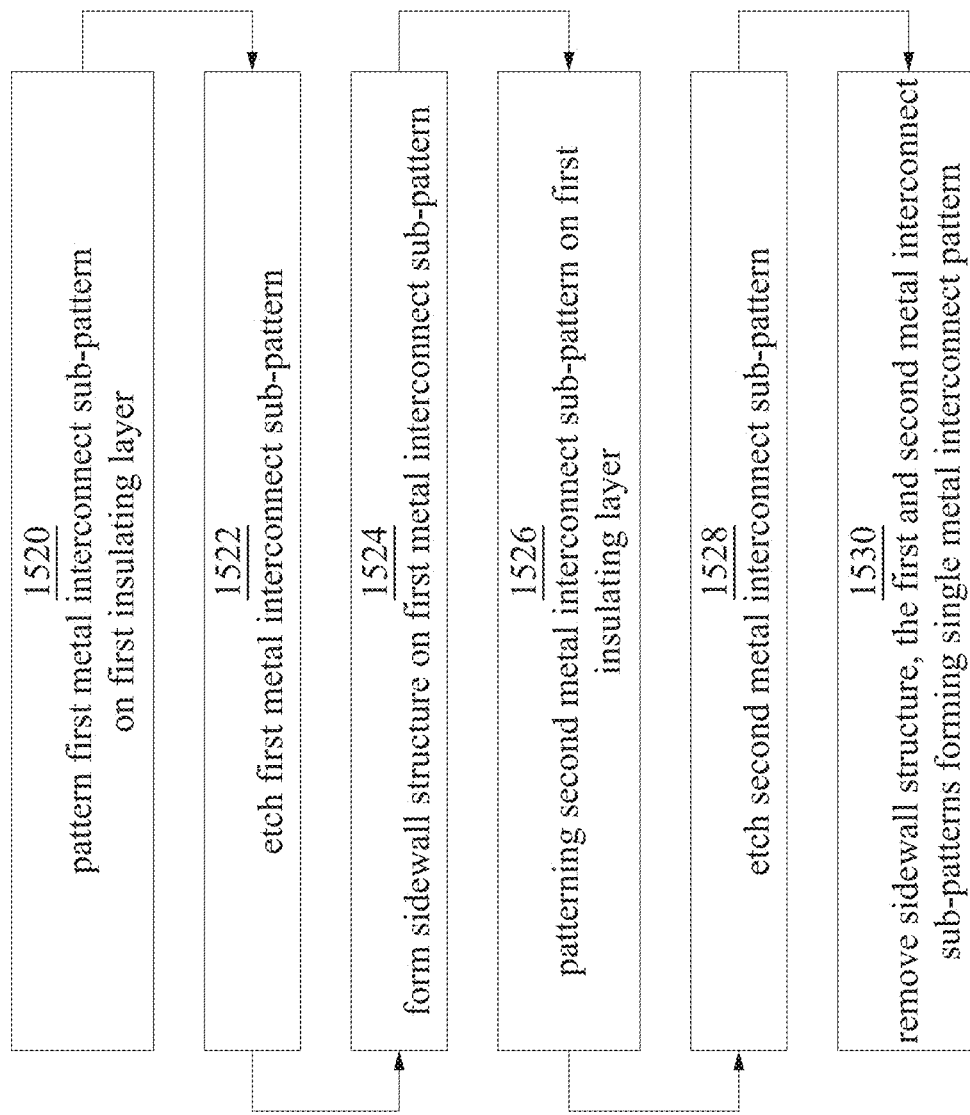
FIG. 15 is a flowchart of a method of manufacturing an integrated circuit, in accordance with some embodiments.

FIG. 15 is a flowchart 1500 of a method of manufacturing an integrated circuit, in accordance with some embodiments.

Method 1500 is implementable, for example, integrated circuit (IC), manufacturing system 1100 (FIG. 11, discussed above), in accordance with some embodiments. Examples of a semiconductor device which can be manufactured according to flowchart 1500 include the semiconductor devices in FIGS. 2B, 3B and 3C, and semiconductor devices based on layout diagrams in FIGS. 2A, 3A, 7, 8, 9A and 9B, or the like.

Method 1500 includes blocks 1520-1530. At block 1520, a first metal interconnect sub-pattern is patterned on a first insulating layer. An example of the first metal interconnect sub-pattern is 506A. From block 1520, flow proceeds to block 1522.

At block 1522, the first metal interconnect sub-pattern is etched. An example of the result of having etched the first metal interconnect sub-pattern is 506A. From block 1522, flow proceeds to block 1524.

At block 524, a sidewall structure is formed on the first metal interconnect sub-pattern. An example of the sidewall structure is 503. From block 1524, flow proceeds to block 1526.

At block 1526, a second metal interconnect sub-pattern is patterned on the first insulating layer. An example of the second metal interconnect sub-pattern is 506B. From block 1526, flow proceeds to block 1528.

At block 1528, the second metal interconnect sub-pattern is etched. An example of the result of having etched the second metal interconnect sub-pattern is 506B. From block 1528, flow proceeds to block 1530.

At block 1530, the sidewall structure is removed resulting in the first and second metal interconnect sub-patterns forming a single metal interconnect pattern. An example of the resultant single metal interconnect pattern is 509.

One aspect of this description relates to a method of designing a layout. The method includes generating a plurality of first routing tracks assigned to a first color group of the layout. The method also includes generating a plurality of second routing tracks assigned to a second color group of the layout, where a first routing track of the plurality of first routing tracks is between adjacent second routing tracks of the plurality of second routing tracks, specifying a color stitching region connecting a selected first routing track of the plurality of first routing tracks with a selected second routing track of the plurality of second routing tracks of the layout, where the color stitching region represents a conductive region that connects a first conductive element represented by the selected first routing track with a second conductive element represented by the selected second routing track through an exposed portion of the selected first routing track, and where the exposed portion is at a removed portion of a sidewall structure surrounding the selected first routing track.

One aspect of this description relates to a method of designing a layout. The method includes generating a plurality of first routing tracks assigned to a first color group of the layout. The method also includes generating a plurality of second routing tracks assigned to a second color group of the layout, where a first routing track of the plurality of first routing tracks is between adjacent second routing tracks of the plurality of second routing tracks, specifying a color stitching region connecting a selected first routing track of the plurality of first routing tracks with a selected second routing track of the plurality of second routing tracks of the layout, where the color stitching region represents a conductive region that connects a first conductive element represented by the selected first routing track with a second conductive element represented by the selected second routing track through an exposed portion of the selected first routing track, and where the exposed portion is at a removed portion of a sidewall structure surrounding the selected first routing track.

In some embodiments, the method includes generating one or more irregular polygonal routing tracks among the plurality of with first routing tracks of the layout and the plurality of second routing tracks of the layout. In some embodiments, the method includes wherein the plurality of first routing tracks and the plurality of second routing tracks represent conductive connections that are sandwiched between two insulating layers and are in direct contact with the two insulating layers. In some embodiments, the method includes forming a via representing a via connection, through one of the two insulating layers, that conductively connects a terminal of a transistor to one of the conductive connections between the two insulating layers, where the terminal of the transistor includes one of a gate, a source, or drain of the transistor.

One aspect of this description relates to a method of manufacturing a semiconductor device. The method includes generating a first cell having a first boundary and a second boundary, both extending in a first-direction, on opposite sides of the first cell, where the first cell includes an irregular polygonal routing track in the first layer of metallization. The method also includes generating a second cell having a first boundary and a second boundary, both extending in a first-direction, on opposite sides of the first cell, where the first cell includes an irregular polygonal routing track in the first layer of metallization. The method also includes aligning the first boundary of the first cell and the first boundary of the second cell to form a common boundary that separates the first cell from the second cell, generating a double-height cell having two cell boundaries, both extending in the first-direction, separated by a distance equal to a double cell distance between the second boundary of the first cell and the second boundary of the second cell, where a first half of the double-height cell and a second half of the double-height cell each have a height that is a half of a height of the double-height cell. The method also includes where the double-height cell has a routing track, in the first layer of metallization that extends from the first half of the double-height cell to the second half of the double-height cell.

In some embodiments, the method includes generating a first routing track, in the first cell, having a run-side along the first boundary; generating a second routing track, in the second cell, having a run-side along the first boundary, where the second routing track is adjacent to the first routing track to exclude any additional routing track between the second routing and the first routing track, where the first routing track belongs to a first group of routing tracks assigned to a first color group of the layout diagram, and the second routing track belongs to a second group of routing tracks assigned to a second color group of the layout diagram. In some embodiments, the method includes generating a first buried power line, extending in the first-direction, underneath a first one of the two cell boundaries, and generating a second buried power line, extending in the first-direction, underneath a second one of the two cell boundaries. In some embodiments, the method includes generating a third buried power line, extending in the first-direction, underneath the double-height cell and passing through the double-height cell at an equal distance to each of the two cell boundaries. In some embodiments, the method includes the first buried power line configured to have a first supply voltage and the third buried power line is configured to have a second supply voltage that is different from the first supply voltage. In some embodiments, the method includes generating a first buried power line, extending in the first-direction, underneath the second boundary of the first cell; and generating a second buried power line, extending in the first-direction, underneath the second boundary of the second cell. In some embodiments, the method includes generating a third buried power line, extending in the first-direction, underneath the common boundary between the first cell and the second cell.

One aspect of this description relates to a method of manufacturing an integrated circuit. The method includes patterning a first metal interconnect sub-pattern on a first insulating layer, etching the first metal interconnect sub-pattern, forming a sidewall structure on the first metal interconnect sub-pattern; patterning a second metal interconnect sub-pattern on the first insulating layer, etching the second metal interconnect sub-pattern; and removing the sidewall structure, the first and second metal interconnect sub-patterns forming a single metal interconnect pattern.

In some embodiments, the method includes patterning the second metal interconnect sub-pattern over a portion of the sidewall structure. In some embodiments, the method includes forming the sidewall structure to a minimum thickness sufficient to meet a minimum metal spacing rule between the first metal interconnect sub-pattern and the second metal interconnect sub-pattern. In some embodiments, the method includes removing a portion of the sidewall structure to expose a stitch portion of the first metal interconnect sub-pattern; and patterning the second metal interconnect sub-pattern over the stitch portion of the first metal interconnect sub-pattern, where the first metal interconnect sub-pattern and the second metal interconnect sub-pattern are in direct electrical contact at the stitch portion. In some embodiments, the method includes positioning a buried power line (VDD) under the first insulating layer, connecting the buried power line to an active area through a first via, and connecting the active area to a signal metal pattern through a second via. In some embodiments, the method includes positioning the buried power line between a first fin structure and a second fin structure of a finfet semiconductor device. In some embodiments, the method includes positioning a buried ground line (VSS) under the single metal interconnect pattern. The method further including positioning the buried ground line and the buried power line on opposite sides of the first or second fin structure. In some embodiments, the method includes forming a first portion the signal metal pattern directly above the buried power line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:
1. A device comprising:
a double-height cell having routing tracks in a first layer of metallization on an insulating layer, the double-height cell having two sides extending in a first direction and separated by the double-height cell in a second direction perpendicular to the first direction, wherein a first routing track has a first run-side extending in the first direction along the first side of the double-height cell, and a second routing track has a second run-side extending in the first direction along the second side of the double-height cell;
a via connection in the insulating layer that connects a terminal of a transistor to one of the routing tracks on the insulating layer, wherein the terminal of the transistor includes one of a gate, a source, or drain of the transistor;
a first buried power line, extending in the first direction, underneath the insulating layer, and aligned with the first run-side of the first routing track in the double-height cell;
a second buried power line, extending in the first direction, underneath the insulating layer, and aligned with the second run-side of the second routing track in the double-height cell; and
a third buried power line, extending in the first direction, underneath the insulating layer, and separated from the first buried power line and the second buried power line at an equal distance to each of the first buried power line and the second buried power line.

2. The device of claim 1, wherein at least one of the routing tracks is an irregular polygonal routing track.

3. The device of claim 1, wherein at least one of the routing tracks crosses the third buried power line from one half of the double-height cell to another half of the double-height cell, and each half of the double-height cell has a height along the second direction that is a half of a height of the double-height cell.

4. The device of claim 1, wherein the first buried power line is configured to have a first supply voltage, and the third buried power line is configured to have a second supply voltage that is different from the first supply voltage.

5. The device of claim 1, wherein the first buried power line and the second buried power line are configured to have a first supply voltage, and the third buried power line is configured to have a second supply voltage that is different from the first supply voltage.

6. The device of claim 1, further comprising:
a first single-height cell including a third routing track that has a third run-side extending in the first direction;
a second single-height cell including a fourth routing track that has a fourth run-side extending in the first direction; and
wherein the third run-side of the third routing track in the first single-height cell is immediately adjacent to the fourth run-side of the fourth routing track in the second single-height cell;
wherein the third run-side of the third routing track in the first single-height cell and the fourth run-side of the fourth routing track in the second single-height cell are aligned with the third buried power line.

7. The device of claim 6, wherein
the first single-height cell includes a fifth routing track that has a fifth run-side extending in the first direction and aligned with the first buried power line; and
the second single-height cell includes a sixth routing track that has a sixth run-side extending in the first direction and aligned with the second buried power line.

8. The device of claim 7, wherein
the first run-side of the first routing track in the double-height cell and the second run-side of the second routing track in the double-height cell are separated from each other in the second direction by a first distance that is equal to a second distance separating the fifth run-side of the fifth routing track in the first single-height cell and the sixth run-side of the sixth routing track in the second single-height cell.

9. A method of manufacturing a semiconductor device, the method comprising, for a layout diagram stored on a non-transitory computer-readable medium and including a first level of metallization representing a first layer of metallization in the semiconductor device, generating the layout diagram including:
generating a first cell having a first boundary and a second boundary, each of the first boundary and the second boundary extending in a first direction, on opposite sides of the first cell, wherein the first cell includes an irregular polygonal routing track in the first layer of metallization;
generating a second cell having a first boundary and a second boundary, each of the first boundary and the second boundary extending in a first direction, on opposite sides of the first cell, wherein the second cell includes an irregular polygonal routing track in the first layer of metallization;
aligning the first boundary of the first cell and the first boundary of the second cell to form a common boundary that separates the first cell from the second cell;
generating a double-height cell having two cell boundaries, each of the two cell boundaries extending in the first direction, separated by a distance equal to a double cell distance between the second boundary of the first cell and the second boundary of the second cell, wherein a first half of the double-height cell and a second half of the double-height cell each have a height that is a half of a height of the double-height cell; and
wherein the double-height cell has a routing track, in the first layer of metallization, that extends from the first half of the double-height cell to the second half of the double-height cell.

10. The method of claim 9, further comprising:
generating a first routing track, in the first cell, having a run-side along the first boundary;
generating a second routing track, in the second cell, having a run-side along the first boundary;
wherein the first routing track in the first cell is immediately adjacent to the second routing track in the second cell; and
wherein the first routing track belongs to a first group of routing tracks assigned to a first color group of the layout diagram, and the second routing track belongs to a second group of routing tracks assigned to a second color group of the layout diagram.

11. The method of claim 9, further comprising:
generating a first buried power line, extending in the first-direction, underneath a first one of the two cell boundaries; and
generating a second buried power line, extending in the first-direction, underneath a second one of the two cell boundaries.

12. The method of claim 11, further comprising:
generating a third buried power line, extending in the first-direction, underneath the double-height cell and passing through the double-height cell at an equal distance to each of the two cell boundaries.

13. The method of claim 12, wherein the first buried power line is configured to have a first supply voltage and the third buried power line is configured to have a second supply voltage that is different from the first supply voltage.

14. The method of claim 12, wherein the first buried power line and the second buried power line are configured to have a first supply voltage and the third buried power line is configured to have a second supply voltage that is different from the first supply voltage.

15. The method of claim 9, further comprising:
generating a first buried power line, extending in the first-direction, underneath the second boundary of the first cell; and
generating a second buried power line, extending in the first-direction, underneath the second boundary of the second cell.

16. The method of claim 15, further comprising:
generating a third buried power line, extending in the first-direction, underneath the common boundary between the first cell and the second cell.

17. A computer program code stored on a non-transitory computer-readable medium for generating a layout design, the computer program code is configured to cause a system having at least one processor to execute:
generating a first cell having a first boundary and a second boundary, each of the first boundary and the second boundary extending in a first direction, on opposite sides of the first cell, wherein the first cell includes an irregular polygonal routing track a first layer of metallization in a semiconductor device;
generating a second cell having a first boundary and a second boundary, each of the first boundary and the second boundary extending in a first direction, on opposite sides of the first cell, wherein the second cell includes an irregular polygonal routing track in the first layer of metallization;
aligning the first boundary of the first cell and the first boundary of the second cell to form a common boundary that separates the first cell from the second cell;
generating a double-height cell having two cell boundaries, each of the two cell boundaries extending in the first direction, separated by a distance equal to a double cell distance between the second boundary of the first cell and the second boundary of the second cell, wherein a first half of the double-height cell and a second half of the double-height cell each have a height that is a half of a height of the double-height cell; and wherein the double-height cell has a routing track, in the first layer of metallization, that extends from the first half of the double-height cell to the second half of the double-height cell.

18. The computer program code of claim 17, wherein the computer program code is further configured to cause the system having at least one processor to execute:
   generating a first routing track, in the first cell, having a run-side along the first boundary;
   generating a second routing track, in the second cell, having a run-side along the first boundary;
   wherein the first routing track in the first cell is immediately adjacent to the second routing track in the second cell; and
   wherein the first routing track belongs to a first group of routing tracks assigned to a first color group of the layout diagram, and the second routing track belongs to a second group of routing tracks assigned to a second color group of the layout diagram.

19. The computer program code of claim 17, wherein the computer program code is further configured to cause the system having at least one processor to execute:
   generating a first buried power line, extending in the first-direction, underneath a first one of the two cell boundaries; and
   generating a second buried power line, extending in the first-direction, underneath a second one of the two cell boundaries.

20. The computer program code of claim 17, wherein the computer program code is further configured to cause the system having at least one processor to execute:
   generating a first buried power line, extending in the first-direction, underneath the second boundary of the first cell; and
   generating a second buried power line, extending in the first-direction, underneath the second boundary of the second cell.

* * * * *